US008551651B2

(12) United States Patent
Misumi et al.

(10) Patent No.: US 8,551,651 B2
(45) Date of Patent: Oct. 8, 2013

(54) SECONDARY CELL HAVING NEGATIVE ELECTRODE BASE MEMBER

(75) Inventors: Koichi Misumi, Kanagawa (JP); Koji Saito, Kanagawa (JP); Mitsuhiro Watanabe, Kanagawa (JP); Hideo Honma, Kanagawa (JP)

(73) Assignees: Tokyo Ohka Kogyo Co., Ltd., Kanagawa (JP); Kanto Gakuin University Surface Engineering Research Institute, Kanagawa (JP)

( * ) Notice: Subject to any disclaimer, the term of this patent is extended or adjusted under 35 U.S.C. 154(b) by 1012 days.

(21) Appl. No.: 12/518,834

(22) PCT Filed: Dec. 11, 2007

(86) PCT No.: PCT/JP2007/073885
§ 371 (c)(1),
(2), (4) Date: Jun. 11, 2009

(87) PCT Pub. No.: WO2008/072638
PCT Pub. Date: Jun. 19, 2008

(65) Prior Publication Data
US 2010/0119939 A1    May 13, 2010

(30) Foreign Application Priority Data

Dec. 15, 2006   (JP) .................................. 2006-339252
Dec. 15, 2006   (JP) .................................. 2006-339253
Dec. 15, 2006   (JP) .................................. 2006-339254
Dec. 15, 2006   (JP) .................................. 2006-339255
Mar. 30, 2007   (JP) .................................. 2007-094430

(51) Int. Cl.
*H01M 4/13* (2010.01)

(52) U.S. Cl.
USPC ........................................................ 429/212

(58) Field of Classification Search
None
See application file for complete search history.

(56) References Cited

U.S. PATENT DOCUMENTS 4,670,528 A     6/1987   Taylor et al.
6,106,998 A  *  8/2000   Maeda et al. .............. 430/280.1

(Continued)

FOREIGN PATENT DOCUMENTS

CN    1318010 A1    10/2001
CN    1415124 A      4/2003

(Continued)

OTHER PUBLICATIONS

Extended European Search Report for EP 12162200.5.

(Continued)

*Primary Examiner* — Barbara Gilliam
*Assistant Examiner* — Stephan Essex
(74) *Attorney, Agent, or Firm* — Hoffmann & Baron, LLP

(57) ABSTRACT

The present invention aims to realize a battery having high output voltage, high energy density and excellent charge and discharge cycle characteristics through a constitution different from those of conventional batteries. Specifically, one of the following negative electrode base members is used as a negative electrode base member for lithium ion secondary batteries: a negative electrode base member wherein a metal film is formed on a support having an organic film; such a negative electrode base member wherein the surface layer of the organic film is covered with a metal oxide film; a negative electrode base member wherein a metal film is formed on a support having a composite film formed from a composite film-forming material containing an organic component and an inorganic component; and a negative electrode base member wherein a silica coating is formed, on a support having a photoresist pattern, from a silica film-forming coating liquid and a metal film is formed on the support after removing the photoresist pattern.

15 Claims, 4 Drawing Sheets

(56) References Cited

U.S. PATENT DOCUMENTS

| | | | |
|---|---|---|---|
| 6,312,863 B1 * | 11/2001 | Hidesaka et al. | 430/193 |
| 6,403,280 B1 * | 6/2002 | Yamahara et al. | 430/270.1 |
| 6,413,285 B1 | 7/2002 | Chu et al. | |
| 2004/0126663 A1 | 7/2004 | Sudano et al. | |
| 2006/0121345 A1 | 6/2006 | Yasuda et al. | |
| 2006/0127758 A1 | 6/2006 | Shishido et al. | |
| 2006/0162770 A1 | 7/2006 | Matsui et al. | |
| 2006/0216603 A1 | 9/2006 | Choi | |
| 2008/0102211 A1 | 5/2008 | Matsuo et al. | |

FOREIGN PATENT DOCUMENTS

| | | |
|---|---|---|
| CN | 1703801 A | 11/2005 |
| CN | 1754930 A | 4/2006 |
| CN | 1797811 A | 7/2006 |
| GB | 1394681 | 5/1975 |
| JP | 2002-83594 | 3/2002 |
| JP | 2002-289177 | 10/2002 |
| JP | 2002-373647 | 12/2002 |
| JP | 2003-17069 | 1/2003 |
| JP | 2003 282064 A | 10/2003 |
| JP | 2005-196971 | 7/2005 |
| JP | 2006-96813 | 4/2006 |
| JP | 2006-216704 | 4/2006 |
| JP | 2006-512722 | 4/2006 |
| JP | 2006-172875 | 6/2006 |
| WO | 0215301 A2 | 2/2002 |
| WO | WO 2005/076389 A2 | 8/2005 |
| WO | 2006003757 A1 | 1/2006 |

OTHER PUBLICATIONS

Supplementary European Search Report for EP 07 85 0441.2, mailed Oct. 6, 2010.
Notice of Reasons for Rejection issued to CN Application No. 200780045668.6, mailed Oct. 12, 2010.
Office Action for CN 201110070852.4, dated Feb. 22, 2012.
JP 2006-96813A, Abstract.
CN 1318010, Abstract.
JP 2006-216704A, Abstract.
Office Action for counterpart foreign application dated Aug. 28, 2012.
English machine translation for JP 2003-282064.
Office action issued to EP Application No. 07850441.2, mailed Apr. 8, 2013.
Notice of Reasons for Rejection issued to CN Application No. CN201110070855.8, mailed Apr. 12, 2013.
English machine translation for CN1415124A.
English machine translation for CN1703801A.

* cited by examiner

US 8,551,651 B2

SECONDARY CELL HAVING NEGATIVE ELECTRODE BASE MEMBER

CROSS-REFERENCE TO RELATED APPLICATIONS

This application is the National Stage of International Application No. PCT/JP2007/073885, filed Dec. 11, 2007, which claims the benefit of Japanese Application Nos. 2006-339252, filed Dec. 15, 2006; 2006-339253, filed Dec. 15, 2006; 2006-339254, filed Dec. 15, 2006; 2006-339255, filed Dec. 15, 2006; and 2007-094430, filed Mar. 30, 2007, the contents of which are incorporated by reference herein.

FIELD OF THE INVENTION

The present invention relates to a negative electrode base member, a secondary cell in which the negative electrode base member is used, a photoresist composition for use in forming the negative electrode base member, a metal oxide film-forming material, a composite film-forming material, and a method for producing the negative electrode base member. In particular, the present invention relates to a negative electrode base member which can provide a battery having superior charge and discharge cycle characteristics, a secondary cell in which the negative electrode base member is used, a photoresist composition for use in forming or producing the negative electrode base member, a metal oxide film-forming material, a composite film-forming material, and a method for producing the negative electrode base member.

BACKGROUND OF THE INVENTION

Conventionally, research and development of batteries having both a high output voltage and a high energy density have been extensively advanced. In particular, secondary cells having a low internal resistance, accompanied by less lowering of cell capacity due to charge and discharge, and that are superior in charge and discharge cycle characteristics have been demanded. For example, a lithium secondary cell in which microcrystalline silicon or amorphous silicon in a state of a thin film is used as a negative electrode material (negative electrode active material) has been known (see, Patent Document 1). Specifically, a lithium secondary cell in which a negative electrode is used that includes a negative electrode material layer composed of a silicon thin film formed on a collector is disclosed. For forming the silicon thin film, thin film formation techniques such as CVD methods (may be also referred to as "chemical vapor-phase growth method", or "chemical vapor deposition method") and sputtering methods have been used.

In such techniques, materials such as silicon are considered to repeatedly expanded/contracted as lithium is stored/released. Since adhesion between the collector and the negative electrode material layer is high in the negative electrode in which a silicon film is formed on the collector, the expansion/contraction of the collector occurs frequently with the expansion/contraction of the negative electrode material. Therefore, charging and discharging may be accompanied by irreversible deformation such as shriveling of the negative electrode material layer and the collector. In particular, when a metal foil that is highly ductile such as copper foil is employed as a collector, the degree of deformation tends to increase. When the negative electrode deformes, the energy density of the battery may decrease due to an increase in electrode volume, thereby producing a heterogeneous electrochemical reaction. In addition, while the expansion/contraction repeats due to charging and discharging, the negative electrode material may be pulverized and become detached from the collector, or may become detached while maintaining the form of a thin film in some cases. Accordingly, the charge and discharge cycle characteristics of the battery may deteriorate.

An exemplary method for inhibiting the deformation of the negative electrode includes a method in which a material having superior mechanical strength such as high tensile strength and elastic modulus in tension is used as a collector. However, when a negative electrode material layer composed of a negative electrode material in the form of a thin film is formed on a collector composed of such a material, the adhesion between the collector and the negative electrode material layer may be insufficient, whereby satisfactory charge and discharge cycle characteristics may not be achieved. Therefore, Patent Document 1 discloses a technique to inhibit occurrence of shriveling and the like while inhibiting detachment of the negative electrode material during charging and discharging by providing a middle layer composed of a material that alloys with the negative electrode material, and using a collector having a mechanical strength greater than that of the middle layer. Specifically, a copper layer is used as the middle layer, and nickel foil is used as the collector.

In addition to Patent Document 1 as described above, a technique is disclosed in which a thin film formed by a solid solution of copper on silicon is used as a negative electrode material layer to control the quantity of storage of lithium, thereby inhibiting expansion of the negative electrode material in the case of storage of lithium (see, Patent Document 2). Furthermore, a technique is disclosed in which an alloy thin film composed of a metal that alloys with lithium, and a metal that does not alloy with lithium are used to control the quantity of storage of lithium, thereby inhibiting expansion of the negative electrode material in the case of storage of lithium (see, Patent Document 3). Specifically, as a metal that forms a solid solution or an intermetallic compound by alloying with lithium, Sn, Ge, Al, In, Mg, Si or the like is used, while Cu, Fe, Ni, Co, Mo, W, Ta, Mn or the like is used as the metal that does not alloy with lithium.

Additionally, a technique is disclosed in which a collector having deformed parts where a deformation amount of 5 μm to 20 μm in a depthwise direction are formed in an amount of 10 or more per $cm^2$, and having an opening ratio of no greater than 4% provided due to the presence of the deformed parts is used, whereby deformation of the electrode resulting from charging and discharging is inhibited (see, Patent Document 4). Moreover, a technique in which a material having no storability of lithium is provided on at least one of the surfaces and the interior of a negative electrode material layer in the form of a thin film which can store/release reversibly lithium is disclosed (see, Patent Document 5).

[Patent Document 1] Japanese Unexamined Patent Application Publication No. 2002-083594.
[Patent Document 2] Japanese Unexamined Patent Application Publication No. 2002-289177.
[Patent Document 3] Japanese Unexamined Patent Application Publication No. 2002-373647.
[Patent Document 4] Japanese Unexamined Patent Application Publication No. 2003-017069.
[Patent Document 5] Japanese Unexamined Patent Application Publication No. 2005-196971.

SUMMARY OF THE INVENTION

The various negative electrode materials described in the foregoing have however failed to achieve a battery which has sufficient output voltage, energy density, and superior charge and discharge cycle characteristics under current circumstances. Accordingly, an object of the present invention is to provide: a negative electrode base member which enables achievement of a battery having a high output voltage and a high energy density, and being superior in charge and discharge cycle characteristics with a construction that is different from those in the aforementioned prior arts; a secondary cell having the negative electrode base member; a method for forming the negative electrode base member; a composite film-forming material for use in forming the negative electrode base member; a metal oxide film-forming material for use in forming the negative electrode base member; a positive-type photoresist composition for use in forming the negative electrode base member; and a photoresist composition for use in forming the negative electrode base member.

The present inventors extensively investigated in view of the foregoing problems, and consequently found that the following can each provide a battery having a high output voltage and a high energy density, and being superior in charge and discharge cycle characteristics: a negative electrode base member including a metal film formed by laminating on an organic film; a negative electrode base member including a metal film formed on a composite film provided by compounding an organic component with an inorganic component; a negative electrode base member including a metal film formed on an organic film having a surface layer covered with a metal oxide film; a negative electrode base member including a metal film formed on a patterned silica coating; and a negative electrode base member including a metal film formed on an organic film made from a positive-type photoresist composition that contains (A) an alkali-soluble resin, and (B) a quinone diazide group-containing compound. Accordingly, the present invention has been completed.

Thus, the present invention provides a negative electrode base member including a metal film formed on a support having an organic film. In addition, provided is a negative electrode base member characterized in that the organic film is formed with a photoresist film, or a negative electrode base member characterized in that the photoresist film has a predetermined shape formed by pattern exposure. Furthermore, a secondary cell having the negative electrode base member, a method for producing the negative electrode base member, and a photoresist composition for use in producing the negative electrode base member are provided.

The present invention provides a negative electrode base member including a metal film formed on a support having an organic film on which the surface layer is covered with a metal oxide film. Moreover, a negative electrode base member in which the organic film is formed with a photoresist film, a negative electrode base member in which the photoresist film has a predetermined shape formed by pattern exposure, and a negative electrode base member in which the metal oxide film is a silica coating are provided. Additionally, a secondary cell in which a negative electrode base member is used, a metal oxide film-forming material and photoresist composition for use in forming the negative electrode base member, and a method for producing a negative electrode base member are provided.

The present invention provides a negative electrode base member including a metal film formed on a support having a composite film made from a composite film-forming material containing an organic component and an inorganic component, a secondary cell in which the negative electrode base member is used, a composite film-forming material for use in forming the negative electrode base member, and a method for producing a negative electrode base member.

The present invention provides: a negative electrode base member produced by forming a silica coating from a silica film-forming coating liquid on a support having a photoresist pattern formed thereon, and forming a metal film on the support from which the photoresist pattern was removed; a secondary cell in which the negative electrode base member is used; a photoresist composition for use in forming the negative electrode base member; and further a method for producing the negative electrode base member.

EFFECTS OF THE INVENTION

According to the present invention, a negative electrode base member which enables achievement of a battery having a high output voltage and a high energy density and being superior in charge and discharge cycle characteristics; a secondary cell having the negative electrode base member; a method for producing the negative electrode base member; a composite film-forming material for use in forming the negative electrode base member; a composition for forming a metal oxide film for use in forming the negative electrode base member; and a photoresist composition for use in forming the negative electrode base member can be provided.

DETAILED DESCRIPTION OF THE INVENTION

Embodiments of the present invention will hereinafter be described in detail with reference to the attached drawings.

First Embodiment

Negative Electrode Base Member

Figure 1:
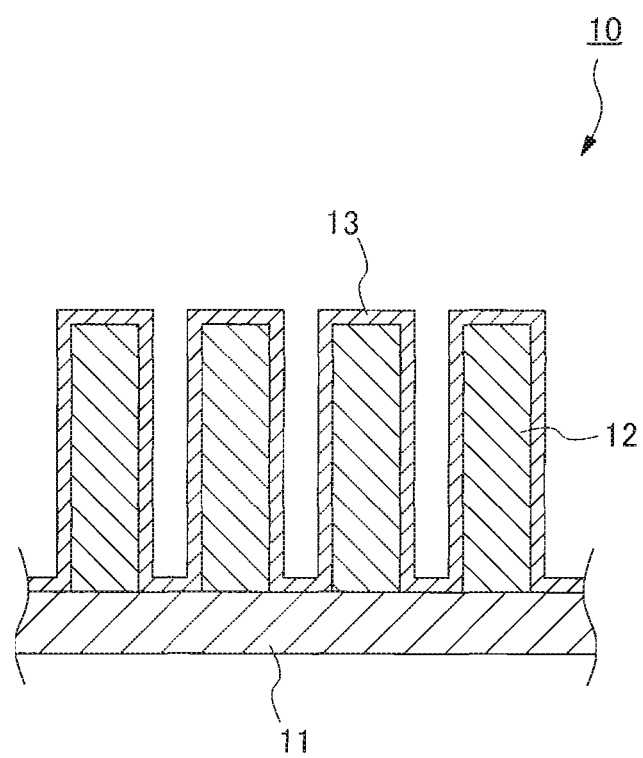
FIG. 1 shows a schematic view illustrating a negative electrode base member of Example 1 according to the present invention.

FIG. 1 shows a schematic view illustrating negative electrode base member 10 according to this embodiment. As is shown in FIG. 1, the negative electrode base member 10 according to this embodiment is composed of support 11, organic film 12, and metal film 13. More specifically, the present invention is characterized by subjecting support 11 having organic film 12 to a plating process to form metal film 13.

Support

The support 11 for use in the negative electrode base member 10 according to this embodiment is not particularly limited as long as the organic film 12 can be formed on the surface thereof. For example, conventionally well-known substrates such as boards for electronic parts may be used. Specific examples include silicon wafers, silicon wafers having an organic or inorganic antireflection film, silicon wafers on which a magnetic film is formed, boards made of metal such as copper, chromium, iron, or aluminum, glass boards, and the like. These supports may serve also as a collector such as a material including at least one element selected from copper, nickel, stainless steel, molybdenum, tungsten, titanium and tantalum, a metal foil, a nonwoven fabric, or a metal collector having a three-dimensional structure, and they may be formed on such a collector.

Organic Film

The organic film 12 of the negative electrode base member 10 according to this embodiment may be formed from a conventionally well-known organic compound or organic resin, but is not limited in particular. Preferably, the organic film 12 is formed from a photoresist composition described later, and more preferably, a photoresist pattern having a predetermined shape formed by pattern exposure.

Photoresist Composition

The photoresist composition for use in the negative electrode base member 10 according to this embodiment is not particularly limited, and a conventionally well-known photoresist composition may be used. Preferably, a hydrophilic group is included. Rigid cohesion with the photoresist pattern is permitted as described above as long as it is situated on a photoresist pattern formed from a photoresist composition including hydrophilic groups, whereby the metal oxide film 13 having superior mechanical strength can be formed with high density.

Positive-Type Photoresist Composition

As the positive-type chemically amplified photoresist composition, a composition including an acid generator component (hereinafter, referred to as "component (A)") capable of producing an acid upon being irradiated with an actinic ray or radiation, and a resin component (hereinafter, referred to as "component (B)") whose solubility in an aqueous alkali solution can be altered by the action of an acid as basic components may be preferably used. As the component (B), a resin is used in which a hydroxy group of an alkali-soluble resin is protected by an acid-dissociating solubility-inhibiting group to be made alkali-insoluble. When the component (B) is used in combination with the component (A), an acid is produced in the exposed regions, allowing dissociation of the acid-dissociating solubility-inhibiting group. As a result, the exposed regions become alkali-soluble, and thus only the exposed regions are selectively removed upon development to produce a photoresist pattern having a predetermined shape.

Acid Generator Component (A)

The component (A) is a substance which produces an acid directly or indirectly upon being irradiated with an actinic ray or radiation.

Examples of such acid generators in a first aspect include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[(2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[(2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following general formula (a1) such as tris(2,3-dibromopropyl) isocyanurate.

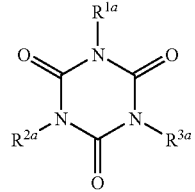

(a1)

In the above general formula (a1), $R^{1a}$, $R^{2a}$, and $R^{3a}$ each independently represent a halogenated alkyl group, and the alkyl group has 1 to 6 carbon atoms.

In addition, examples of the acid generator in a second aspect include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, and α-(ethylsulfonyloxyimino)-1-cyclopentenylacetonitrile, and compounds represented by the following general formula (a2) including an oxime-sulfonate group.

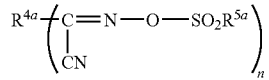

(a2)

In the above general formula (a2), $R^{4a}$ represents a monovalent, bivalent, or trivalent organic group; $R^{5a}$ represents a substituted or unsubstituted, saturated or unsaturated hydrocarbon group, or an aromatic compound group; and n is an integer of 1 to 6.

It is particularly preferable that $R^{4a}$ in the above general formula (a2) be an aromatic compound group; and examples of such aromatic compound groups include aromatic hydrocarbon groups such as a phenyl group and a naphthyl group, and heterocyclic groups such as a furyl group and thienyl group. These may have one or more appropriate substituents such as halogen atoms, alkyl groups, alkoxy groups and nitro groups on the rings. It is also particularly preferable that $R^{5a}$ is a lower alkyl group having 1 to 6 carbon atoms such as a methyl group, ethyl group, propyl group and butyl group.

Examples of the acid generator represented by the above general formula (a2) include when n is 1, compounds in which $R^{4a}$ is a phenyl group, a methylphenyl group or a methoxyphenyl group and $R^{5a}$ is a methyl group. Specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile, and the like. When n is 2, the acid generator represented by the above general formula is specifically one represented by the following chemical formulas (a2-1) to (a2-8).

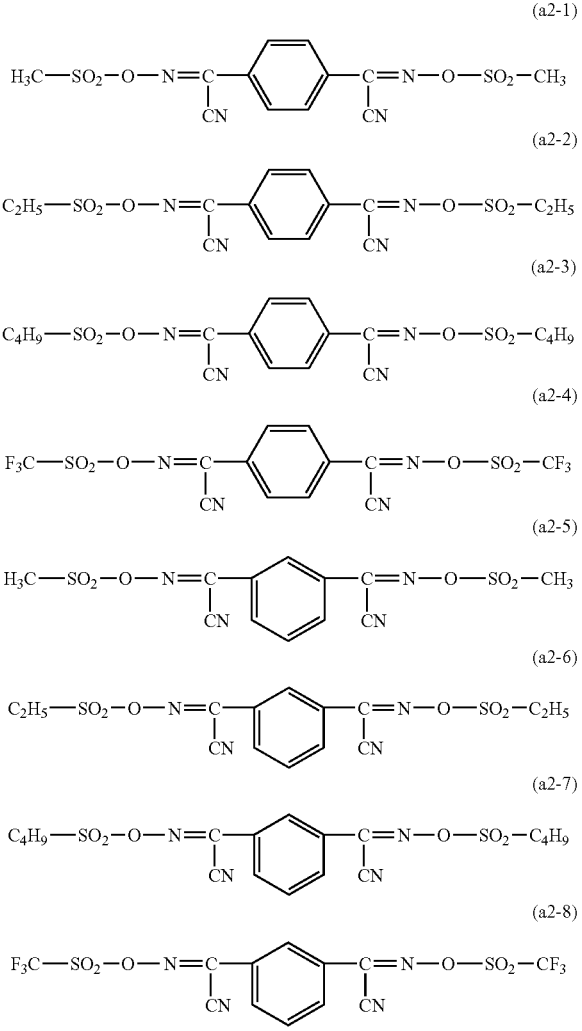

In addition, examples of the acid generator in a third aspect are onium salts that have a naphthalene ring at their cation moieties. The expression "have a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxy group, a linear or branched alkoxy group having 1 to 6 carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 to 3.

Preferably, the cation moiety of onium salts having a naphthalene ring at the cation moiety is of the structure expressed by the general formula (a3) below.

In the above general formula (a3), at least one of $R^{6a}$, $R^{7a}$ and $R^{8a}$ is a group represented by the following general formula (a4), and the remaining area linear or branched alkyl group having 1 to 6 carbon atoms, a phenyl group which may have a substituent, a hydroxy group, or a linear or branched alkoxy group having 1 to 6 carbon atoms. Alternatively, it is acceptable that one of $R^{6a}$, $R^{7a}$ and $R^{8a}$ is a group represented by the following general formula (a4), and the remaining two are each independently a linear or branched alkylene group having 1 to 6 carbon atoms, the terminals of which may bond to form a ring structure.

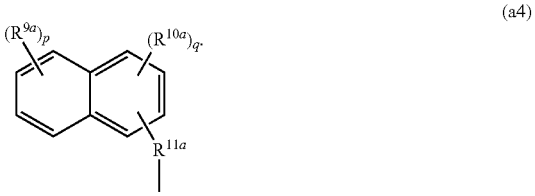

In the above general formula (a4), $R^{9a}$ and $R^{10a}$ each independently represent a hydroxy group, a linear or branched alkoxy group having 1 to 6 carbon atoms, or a linear or branched alkyl group having 1 to 6 carbon atoms; $R^{11a}$ represents a single bond, or a linear or branched alkylene group having 1 to 6 carbon atoms which may have a substituent; p and q are each independently an integer of 0 or 1 to 2; and p+q is no greater than 3. In this regard, when there exists a plurality of $R^{10a}$, they may be identical or different from each other. Furthermore, when there exists a plurality of $R^{9a}$, they may be identical or different from each other.

Among $R^{6a}$, $R^{7a}$ and $R^{8a}$ described above, the number of groups represented by the above general formula (a4) is preferably one, in light of stability of the compound, and the remainings are linear or branched alkyl groups having 1 to 6 carbon atoms, or a phenyl group which may have a substituent, the terminals of which may bond to form a ring structure. In this case, the two alkylene groups described above form a 3 to 9 membered ring including sulfur atom(s). Preferably, the number of atoms to form the ring (including sulfur atom(s)) is 5 or 6.

The substituent, which the alkylene group may have, is exemplified by an oxygen atom (in this case, a carbonyl group is formed together with a carbon atom which constitute the alkylene group), a hydroxy group or the like.

The substituent, which the phenyl group may have, is exemplified by a hydroxy group, a linear or branched alkoxy group having 1 to 6 carbon atoms, a linear or branched alkyl group having 1 to 6 carbon atoms or the like.

These cation moieties are preferably those represented by the following chemical formulas (a5) and (a6) and the like, and the structure represented by the chemical formula (a6) is particularly preferred.

(a5)

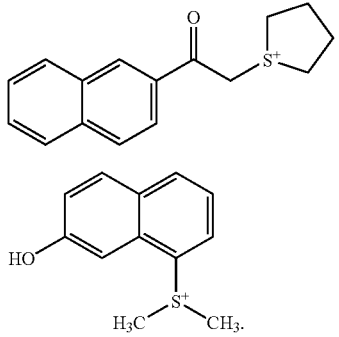

(a6)

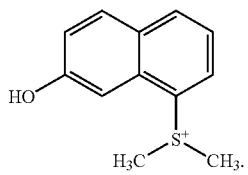

(a10)

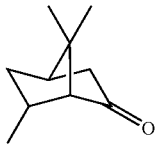

The cation moieties, which may be of an iodonium salt or a sulfonium salt, are desirably of a sulfonium salt in view of acid-producing efficiency.

It is, therefore, desirable that the preferable anion moiety of the onium salt having a naphthalene ring at the cation moiety is an anion capable of forming a sulfonium salt.

As the anion moiety of the photo acid generator, aryl sulfonate ions, and fluoroalkylsulfonate ions, of which hydrogen atom(s) being partially or entirely fluorinated are preferred.

The alkyl group of the fluoroalkylsulfonate ions may be linear, branched or cyclic and have 1 to 20 carbon atoms; and preferably have 1 to 10 carbon atoms in view of bulkiness and diffusion distance of the produced acid. In particular, branched or cyclic alkyl groups are preferable due to shorter diffusion length. Specifically, methyl, ethyl, propyl, butyl, octyl groups and the like are preferable due to being inexpensively synthesizable.

The aryl group of the aryl sulfonate ions may be an aryl group having 6 to 20 carbon atoms, and is exemplified by a phenyl group or a naphthyl group that may be substituted or unsubstituted with alkyl groups or halogen atoms; and aryl groups having 6 to 10 carbon atoms are preferable since these can be synthesized inexpensively. Specifically, phenyl, toluene sulfonyl, ethylphenyl, naphthyl, methylnaphtyl groups and the like are preferable.

When the hydrogen atom is partially or entirely fluorinated in the fluoroalkylsulfonate ions or aryl sulfonate ions, the fluorination rate is preferably 10% to 100%, and more preferably 50% to 100%; it is particularly preferable that all of hydrogen atoms are substituted with fluorine atoms in view of higher acid strength. Specific examples thereof include trifluoromethane sulfonate, perfluorobutane sulfonate, perfluorooctane sulfonate, perfluorobenzene sulfonate, and the like.

Among others, the preferable anion moiety is exemplified by those represented by the following general formula (a7).

$$R^{12a}SO_3^-$$ (a7)

In the above general formula (a7), $R^{12a}$ represents a structure represented by the following general formula (a8) or (a9), or by the chemical formula (a10).

$$—C_lF_{2l+1}$$ (a8)

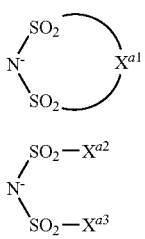 (a9)

In the above general formula (a8), l is an integer of 1 to 4, $R^{13a}$ in the general formula (a9) is a hydrogen atom, a hydroxy group, a linear or branched alkyl group having 1 to 6 carbon atoms or a linear or branched alkoxy group having 1 to 6 carbon atoms; and m is an integer of 1 to 3. Among others, trifluoromethane sulfonate and perfluorobutane sulfonate are preferable in view of safety.

In addition, a nitrogen-containing moiety represented by the following formula (a11) or (a12) may be also used for the anion moiety.

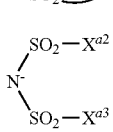 (a11)

(a12)

In the above formulas (a11) and (a12), $X^{a1}$ represents a linear or branched alkylene group of which at least one hydrogen atom is substituted with a fluorine atom, the number of carbon atoms of the alkylene group is 2 to 6, preferably 3 to 5, and most preferably the number of carbon atoms is 3. In addition, $X^{a2}$ and $X^{a3}$ each independently represent a linear or branched alkyl group of which at least one hydrogen atom is substituted with a fluorine atom, the number of carbon atoms of the alkyl group is 1 to 10, preferably 1 to 7, and more preferably 1 to 3.

The smaller number of carbon atoms in the alkylene group of $X^{a1}$ or in the alkyl group of $X^{a2}$ or $X^{a3}$ is preferred since the solubility into resist solvent increases.

In addition, the larger number of hydrogen atoms substituted by fluorine atoms in $X^{a1}$ of the alkylene group or in $X^{a2}$ or $X^{a3}$ of the alkyl group is preferred since the acid strength is enhanced. The percentage of fluorine atoms in the alkylene or alkyl group, i.e., the fluorination rate, is preferably 70% to 100% and more preferably 90% to 100%, and most preferable are perfluoroalkylene or perfluoroalkyl groups in which all of the hydrogen atoms are substituted with fluorine atoms.

Preferable onium salts having a naphthalene ring at their cation moieties may be the compounds represented by the following chemical formula (a13) or (a14).

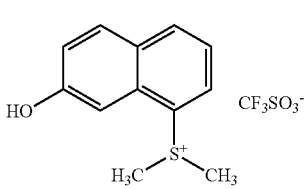 (a13)

(a14)

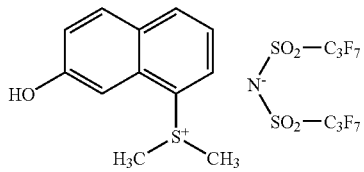

Examples of the acid generator in another aspect include bissulfonyldiazomethanes such as bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonate esters such as pyrogallol trimesylate, pyrogallol tritosylate, benzyl tosylate, benzylsulfonate, N-methylsulfonyloxy succinimide, N-trichloromethylsulfonyloxy succinimide, N-phenylsulfonyloxy maleimide and N-methylsulfonyloxy phthalimide; trifluoromethane sulfonate esters such as N-hydroxyphthalimide and N-hydroxynaphthalimide; onium salts such as diphenyliodonium hexafluorophosphate, (4-methoxyphenyl) phenyliodonium trifluoromethane sulfonate, bis(p-tert-butylphenyl)iodonium trifluoromethane sulfonate, triphenylsulfonium hexafluorophosphate, (4-methoxyphenyl) diphenylsulfonium trifluoromethane sulfonate and (p-tert-butylphenyl)diphenylsulfonium trifluoromethane sulfonate; benzoin tosilates such as benzoin tosilate and α-methylbenzoin tosilate; other diphenyliodonium salts, triphenylsulfonium salts, phenyldiazonium salts, benzylcarbonates, and the like.

In addition, examples of the acid generator which may be used in a fourth aspect include the compounds represented by the following general formula (a15).

$$R^{14a}{}_s X^{a4+} \!\!-\!\!\left[\! X^{a5} \!\!-\!\! \underset{\underset{R^{14a}{}_{s-1}}{|}}{X^{a4+}} \!\!-\!\!\right]_n \!\!\!\! R^{14a}(n+1) X^{a6-}$$
(a15)

In the above formula (a15), $X^{a4}$ represents a sulfur or iodine atom with an atomic valence of s, where s is 1 or 2. n represents a repeating unit of the structure in parenthesis. $R^{14a}$, which is an organic group bonding to $X^{a4}$, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and $R^{14a}$ may be substituted with at least one selected from the group consisting of alkyl, hydroxy, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, amino, cyano and nitro groups, and a halogen atom. The number of $R^{14a}$ is s+n (s−1)+1; and a plurality of $R^{14a}$ may be identical or different from each other. In addition, two or more $R^{14a}$ may bond directly or via —O—, —S—, —SO—, —SO$_2$—, —NH—, —NR$^{15a}$—, —CO—, —COO—, —CONH—, an alkylene group having 1 to 3 carbon atoms, or a phenylene group to form a ring structure containing $X^{a4}$. $R^{15a}$ represents an alkyl group having 1 to 5 carbon atoms or an aryl group having 6 to 10 carbon atoms.

$X^{a5}$ is a structure represented by the following general formula (a16).

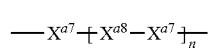
(a16)

In the above formula (a16), $X^{a7}$ represents an alkylene group having 1 to 8 carbon atoms, an arylene group having 6 to 20 carbon atoms, or a bivalent group of a heterocyclic compound having 8 to 20 carbon atoms; $X^{a7}$ may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group, and a halogen atom. $X^{a8}$ represents —O—, —S—, —SO—, —SO$_2$—, —NH—, —NR$^{15a}$—, —CO—, —COO—, —CONH—, an alkylene group having 1 to 3 carbon atoms, or a phenylene group. n represents the number of repeating units of the structure in parenthesis. $X^{a7}$s present in the number of "n+1", and $X^{a8}$ present in the number of "n" may be identical or different from each other. $R^{15a}$ is as defined above.

$X^{a6-}$ is a counter ion of an onium. The number of $X^{a6-}$ is n+1 per molecule, and at least one thereof may be an anion of fluorinated alkylfluorophosphoric acid represented by the general formula (a17) below, and the remaining may be other anions.

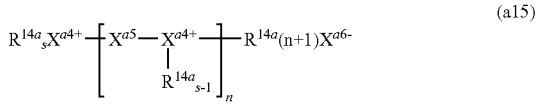
(a17)

In the above formula (a17), $R^{16a}$ represents an alkyl group in which at least 80% of the hydrogen atoms are substituted with fluorine atoms. t represents the number thereof, and is an integer of 1 to 5. $R^{16a}$ present in the number of "t" may be identical or different from each other.

Specific examples of preferable onium ion in the above general formula (a15) include triphenylsulfonium, tri-p-tolylsulfonium, 4-(phenylthio)phenyldiphenylsulfonium, bis[4-(diphenylsulfonio)phenyl]sulfide, bis[4-(bis[4-(2-hydroxyethoxy)phenyl]sulfonio)phenyl]sulfide, bis(4-[bis(4-fluorophenyl)sulfonio]phenyl)sulfide, 4-(4-benzoyl-2-chlorophenylthio)phenylbis(4-fluorophenyl)sulfonium, 4-(4-benzoylphenylthio)phenyldiphenylsulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(diphenyl)sulfonio] thioxanthone, 4-[4-(4-tert-butylbenzoyl)phenylthio] phenyldi-p-tolylsulfonium, 4-(4-benzoylphenylthio) phenyldiphenylsulfonium, diphenylphenacylsulfonium, 4-hydroxyphenylmethylbenzylsulfonium, 2-naphthylmethyl (1-ethoxycarbonyl)ethylsulfonium, 4-hydroxyphenylmethylphenacylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

The anion component in the above general formula (a15) has at least one anion of fluorinated alkyl fluorophosphoric acid represented by the above general formula (a17). The other anion components may be other anions. The other anions, not limited specifically, may be conventional anions. Examples of the other anion include halogen ions such as F$^-$, Cl$^-$, Br$^-$ and I$^-$; OH$^-$; ClO$_4^-$; sulfonate ions such as FSO$_3^-$, ClSO$_3^-$, CH$_3$SO$_3^-$, C$_6$H$_5$SO$_3^-$, and CF$_3$SO$_3^-$; sulfate ions such as HSO$_4^-$, and SO$_4^{2-}$; carbonate ions such as HCO$_3^-$, and $CO_3^{2-}$; phosphate ions such as $H_2PO_4^-$, $HPO_4^{2-}$, and $PO_4^{3-}$; fluorophosphate ions such as $PF_6^-$, and $PF_5OH^-$; borate ions such as $BF_4^-$, $B(C_6F_5)_4^-$, and $B(C_6H_4CF_3)_4^-$; $AlCl_4^-$; $BiF_6^-$; and the like. Other examples include fluoroantimonate ions such as $SbF_6^-$ and $SbF_5OH^-$, as well as fluoroarsenate ions such as $A_sF_6^-$ and $AsF_5OH^-$, but these are not preferred since a toxic element is included.

In regards to the anions of fluorinated alkyl fluorophosphoric acid represented by the above general formula (a17), $R^{16a}$ represents an alkyl group substituted with fluorine atoms, preferably having 1 to 8 carbon atoms, and more preferably 1 to 4 carbon atoms. Specific examples of the alkyl group include linear alkyl groups such as of methyl, ethyl, propyl, butyl, pentyl and octyl; branched alkyl groups such as of isopropyl, isobutyl, sec-butyl and tert-butyl; and cycloalkyl groups such as of cyclopropyl, cyclobutyl, cyclopentyl and cyclohexyl. The rate of hydrogen atoms in alkyl groups substituted with fluorine atoms is usually at least 80%, preferably at least 90%, and more preferably 100%. When the substitutional rate with fluorine atoms is below 80%, the acid strength of the onium fluorinated alkyl fluorophosphate represented by the above general formula (a15) tends to be low.

Particularly preferable $R^{16a}$ is a linear or branched perfluoroalkyl group having 1 to 4 carbon atoms and having a substitutional rate of hydrogen atoms with fluorine atoms being 100%. Specific examples of $R^{16a}$ include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number t of $R^{16a}$ is an integer of 1 to 5, preferably 2 to 4, and particularly preferably 2 or 3.

Specific examples of preferable anion of fluorinated alkyl fluorophosphoric acid include $[(CF_3CF_2)_2PF_4]^-$, $[(CF_3CF_2)_3PF_3]^-$, $[((CF_3))_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[(CF_3CF_2CF_2)_3PF_3]^-$, Of these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_3]^-$, $[((CF_3)_2CFCF_2)_3PF_3]^-$, and $[(CF_3)_2CFCF_2)_2PF_4]^-$ are particularly preferred.

Among the onium fluorinated alkyl fluorophosphates represented by the above general formula (a15), diphenyl[4-(phenylthio)phenyl]sulfonium trifluorotrisfluoroalkylphosphate represented by the following general formula (a18) is particularly preferably used.

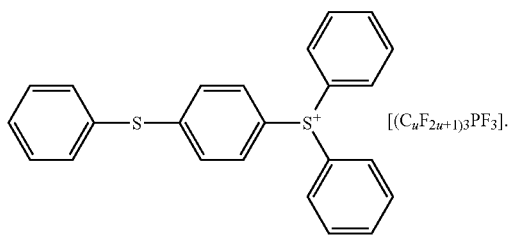

(a18)

In the above formula (a18), u is an integer of 1 to 8, and more preferably an integer of 1 to 4.

Preferably, at least one selected from the general formulas (a2), and (a18) is used as the acid generator of the component (A), and in the general formula (a2): the preferable number of n is 2; preferable $R^{4a}$ is a bivalent substituted or unsubstituted alkylene group having 1 to 8 carbon atoms, or a substituted or unsubstituted aromatic group; and preferable $R^{5a}$ is a substituted or unsubstituted alkyl group having 1 to 8 carbon atoms, or a substituted or unsubstituted aryl group.

The component (A) described above may be used alone or in combination of two or more.

Moreover, an amount of the component (B) is preferably 0.05 to 5% by mass in the positive-type photoresist composition. An amount of the component (A) of no less than 0.05% by mass may result in sufficient sensitivity, and an amount of no more than 5% by mass tends to enhance solubility in a solvent and to provide a uniform solution and to improve preservation stability.

Resin Component (B)

The resin component may be a resin including at least one of a novolac resin (B1), a polyhydroxystyrene resin (B2), and an acrylic resin (B3), whose alkali solubility can be increased by the action of an acid, or a mixed resin or a copolymer thereof.

Novolac Resin (B1)

The resin represented by the following general formula (b1) can be used for the novolac resin (B1), whose alkali solubility can be increased by the action of an acid.

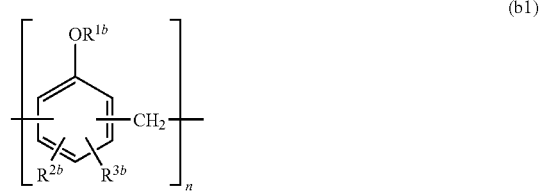

(b1)

In the above general formula (b1), $R^{1b}$ represents an acid-dissociating solubility-inhibiting group; $R^{2b}$ and $R^{3b}$ each independently represent a hydrogen atom or an alkyl group having 1 to 6 carbon atoms; and n represents repeating units.

Furthermore, the acid-dissociating solubility-inhibiting group represented by the above $R^{1b}$ is preferably a linear, branched or cyclic alkyl group having 1 to 6 carbon atoms represented by the following general formula (b2) or (b3), such as a tetrahydropyranyl group, a tetrafuranyl group, or a trialkylsilyl group.

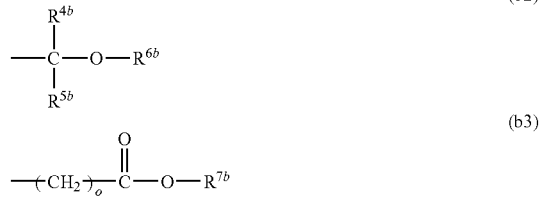

(b2)

(b3)

In the above general formulas (b2) and (b3), $R^{4b}$ and $R^{5b}$ each independently represent a hydrogen atom, or a linear or branched alkyl group having 1 to 6 carbon atoms; $R^{6b}$ represents a linear, branched, or cyclic alkyl group having 1 to 10 carbon atoms; $R^{7b}$ represents a linear, branched, or cyclic alkyl group having 1 to 6 carbon atoms; and o is 0 or 1.

Examples of the linear or branched alkyl group having 1 to 6 carbon atoms include a methyl group, ethyl group, propyl group, isopropyl group, n-butyl group, isobutyl group, tert-butyl group, pentyl group, isopentyl group, and neopentyl group; and examples of the cyclic alkyl group include a cyclopentyl group and cyclohexyl group.

Specific examples of the acid-dissociating solubility-inhibiting group represented by the above general formula (b2) include a methoxyethyl group, ethoxyethyl group, n-propoxyethyl group, iso-propoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group 1-ethoxy-1-methyl-ethyl group, and the like; and examples of the acid-dissociating solubility-inhibiting group represented by the above formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 to 6 carbon atoms.

Polyhydroxystyrene Resin (B2)

The resin represented by the following general formula (b4) can be used for the polyhydroxystyrene resin (B2), whose alkali solubility can be increased by the action of an acid.

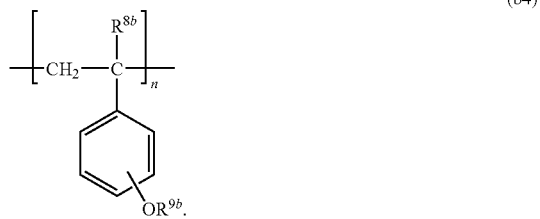

(b4)

In the above general formula (b4), $R^{8b}$ represents a hydrogen atom or an alkyl group having 1 to 6 carbon atoms; $R^{9b}$ represents an acid-dissociating solubility-inhibiting group; and n represents repeating units.

Examples of the linear or branched alkyl group having 1 to 6 carbon atoms include a methyl group, ethyl group, propyl group, isopropyl group, n-butyl group, isobutyl group, tert-butyl group, pentyl group, isopentyl group, neopentyl group and the like; and examples of the cyclic alkyl group include a cyclopentyl group, cyclohexyl group and the like.

The acid-dissociating solubility-inhibiting group represented by the above $R^{9b}$ may be similar to the acid-dissociating solubility-inhibiting groups exemplified in terms of the above general formulas (b2) and (b3).

Furthermore, the polyhydroxystyrene resin (B2), whose alkali solubility can be increased by the action of an acid, may contain another polymerizable compound as a structural unit in order to moderately control physical and/or chemical properties. The polymerizable compound is exemplified by conventionally well-known radical polymerizable compounds and anion polymerizable compounds. Examples thereof include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl(meth)acrylate and butyl(meth)acrylate; (meth)acrylic acid hydroxyalkyl esters such as 2-hydroxyethyl(meth)acrylate and 2-hydroxypropyl(meth)acrylate; (meth)acrylic acid aryl esters such as phenyl(meth)acrylate and benzyl(meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

Acrylic Resin (B3)

The resin represented by the following general formulas (b5) to (b7) can be used for the acrylic resin (B3), whose alkali solubility can be increased by the action of an acid.

(b5)

(b6)

(b7)

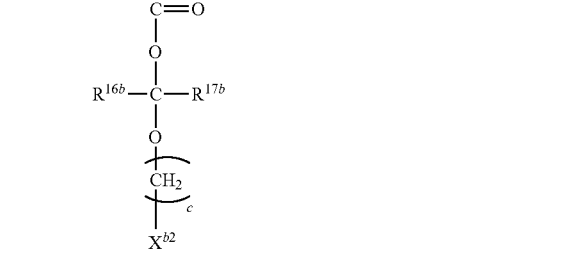

In the above general formulas (b5) to (b7), $R^{10b}$ to $R^{17b}$ each independently represent a hydrogen atom, a linear or branched alkyl group having 1 to 6 carbon atoms, a fluorine atom, or a linear or branched fluorinated alkyl group having 1 to 6 carbon atoms (in which, $R^{11b}$ is not a hydrogen atom); $X^{b1}$ and the neighboring carbon atoms form a hydrocarbon ring having 5 to 20 carbon atoms; $X^{b2}$ represents an alicyclic group or alkyl group that may have a substituent; n represents repeating units; c is an integer of 0 to 4; and d is 0 or 1.

Examples of the linear or branched alkyl group having 1 to 6 carbon atoms include a methyl group, ethyl group, propyl group, isopropyl group, n-butyl group, isobutyl group, tert-butyl group, pentyl group, isopentyl group and neopentyl group; examples of the cyclic alkyl group include a cyclopentyl group and cyclohexyl group. Also, the fluorinated alkyl group refers to the abovementioned alkyl groups of which the hydrogen atoms are partially or entirely substituted with fluorine atoms.

Preferably, the aforementioned $R^{11b}$ is a linear or branched alkyl group having 2 to 4 carbon atoms in view of higher contrast, proper resolution and focus depth width, etc.; and preferably, $R^{13b}$, $R^{14b}$, $R^{16b}$ and $R^{17b}$ are each a hydrogen atom or a methyl group.

The abovementioned $X^{b1}$ and the neighboring carbon atoms form an alicyclic group having 5 to 20 carbon atoms. Specific examples of the alicyclic group are the groups of monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane and polycycloalkanes such as adamantane, norbornane, isobornane, tricyclodecane and tetracyclododecane from which at least one hydrogen atom is removed. Particularly preferable are cyclohexane and adamantane from which at least one hydrogen atom is removed (that may further have a substituent).

Furthermore, when the alicyclic group of the abovementioned $X^{b1}$ has a substituent on the ring skeleton, the substituent is exemplified by polar groups such as a hydroxy group, carboxy group, cyano group and oxygen atom (=O), and linear or branched lower alkyl groups having 1 to 4 carbon atoms. The polar group is preferably an oxygen atom (=O) in particular.

The aforementioned $X^{b2}$ is an alicyclic group or an alkyl group; examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferable is adamantane from which at least one hydrogen atom is removed (that may further have a substituent).

When the alicyclic group of the abovementioned $X^{b2}$ has a substituent on the ring skeleton, the substituent is exemplified by polar groups such as a hydroxy group, a carboxy group, a cyano group and an oxygen atom (=O), and linear or branched lower alkyl groups having 1 to 4 carbon atoms. The polar group is preferably an oxygen atom (=O) in particular.

Also, when $X^{b2}$ is an alkyl group, it is preferably a linear or branched alkyl group having 1 to 20 carbon atoms, and more preferably 6 to 15 carbon atoms. Preferably, the alkyl group is an alkoxyalkyl group in particular; examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group and 1-ethoxy-1-methylethyl group.

Preferable specific examples of the acrylic resin represented by the above general formula (b5) are those represented by the following general formulas (b5-1) to (b5-3).

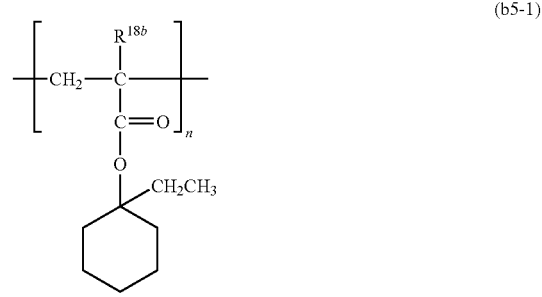

(b5-1)

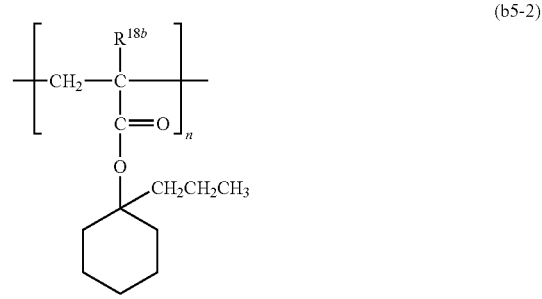

(b5-2)

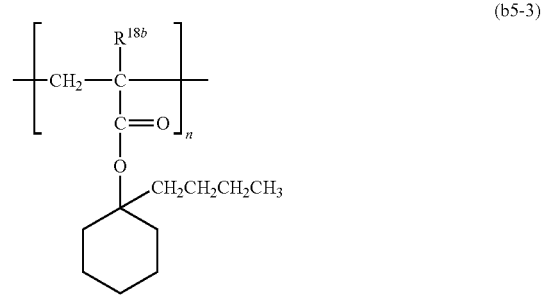

(b5-3)

$R^{18b}$ in the above general formulas (b5-1) to (b5-3) represents a hydrogen atom or a methyl group; and n represents repeating units.

Preferable specific examples of the acrylic resin represented by the above general formula (b6) include those represented by the following general formulas (b6-1) to (b6-28).

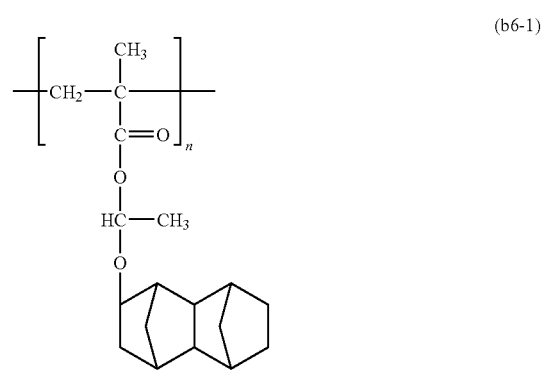

(b6-1)

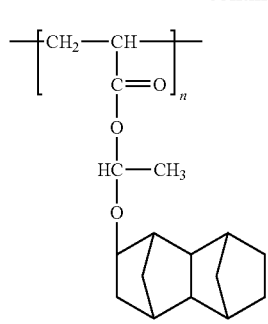
(b6-2)
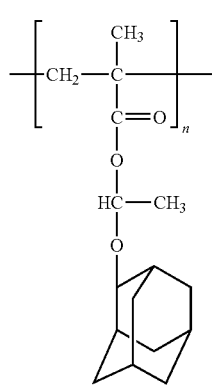
(b6-3)
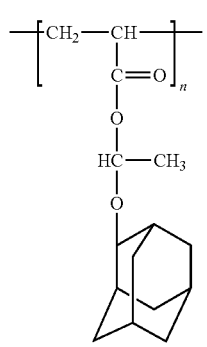
(b6-4)
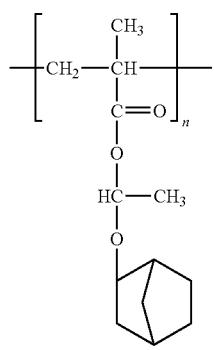
(b6-5)
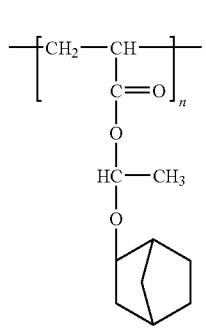
(b6-6)
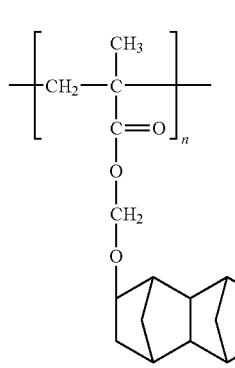
(b6-7)
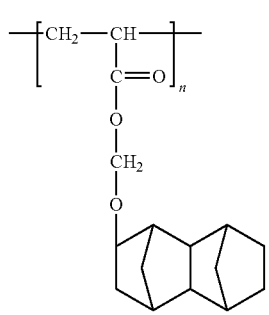
(b6-8)
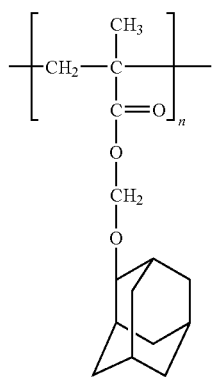
(b6-9)

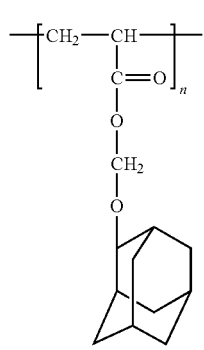
(b6-10)
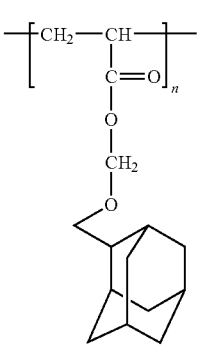
(b6-14)
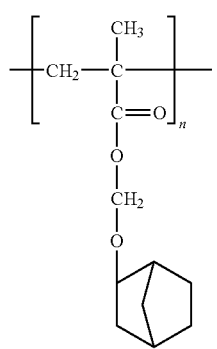
(b6-11)
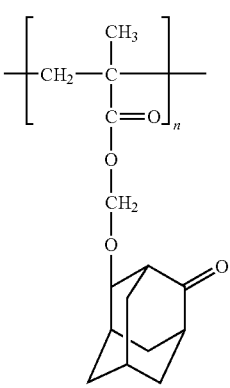
(b6-15)
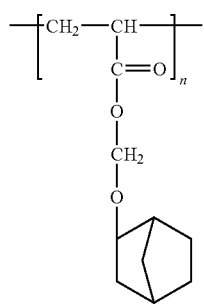
(b6-12)
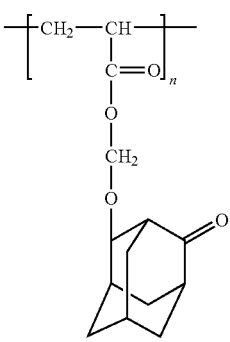
(b6-16)
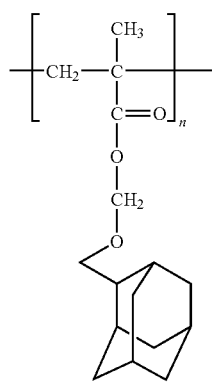
(b6-13)
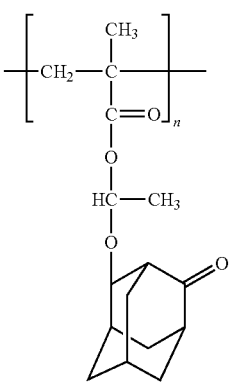
(b6-17)

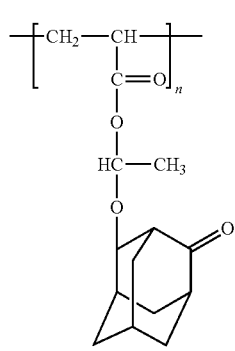
(b6-18)
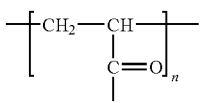
(b6-19)
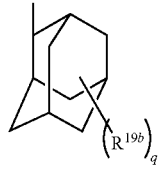
(b6-20)
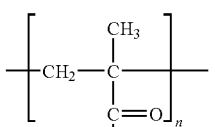
(b6-21)
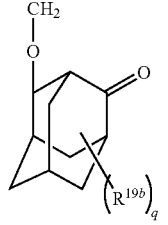
(b6-22)
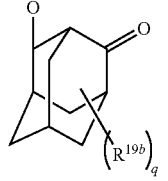
(b6-23)
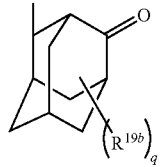
(b6-24)
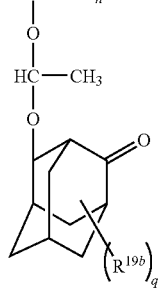
(b6-25)

(b6-26)
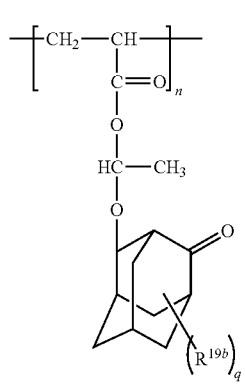
(b6-27)
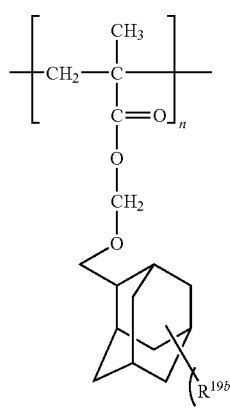
(b6-28)
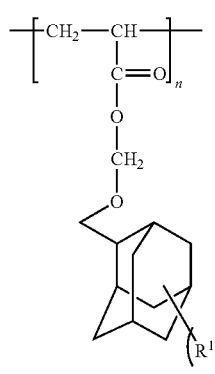
Preferable specific examples of the acrylic resin represented by the above general formula (b7) include those represented by the following general formulas (b7-1) to (b7-22).
(b7-1)
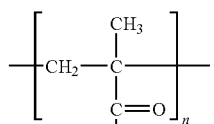
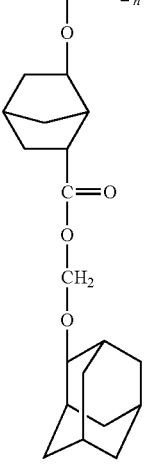
(b7-2)
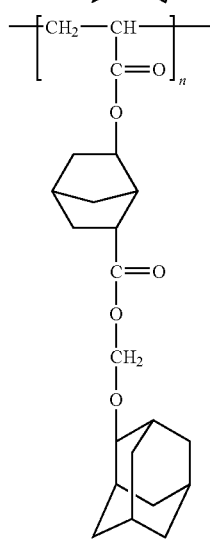
(b7-3)
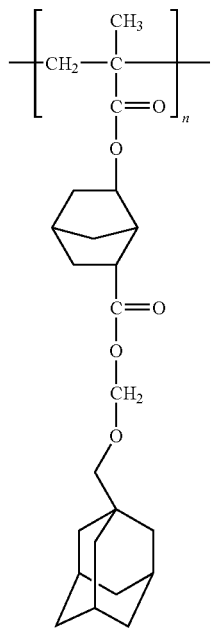

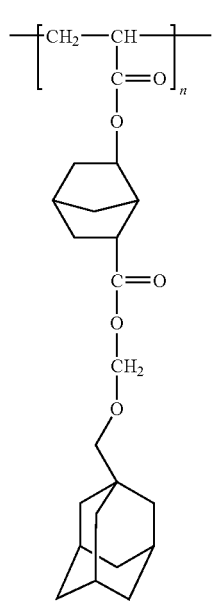
(b7-4)
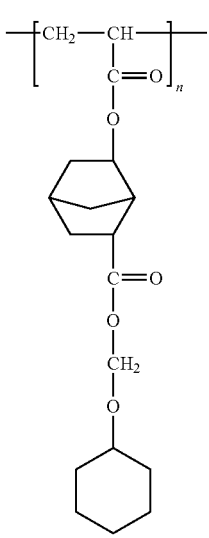
(b7-6)
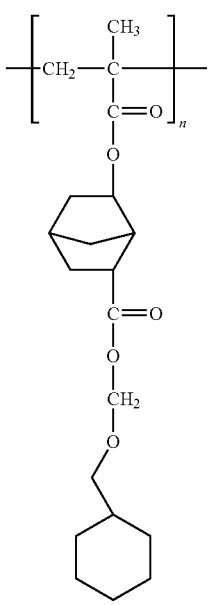
(b7-5)
(b7-7)

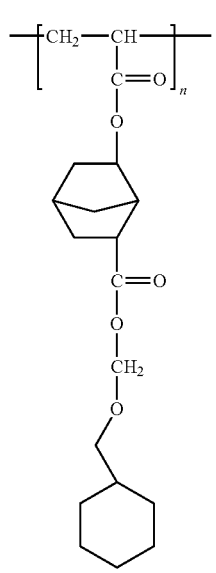
(b7-8)
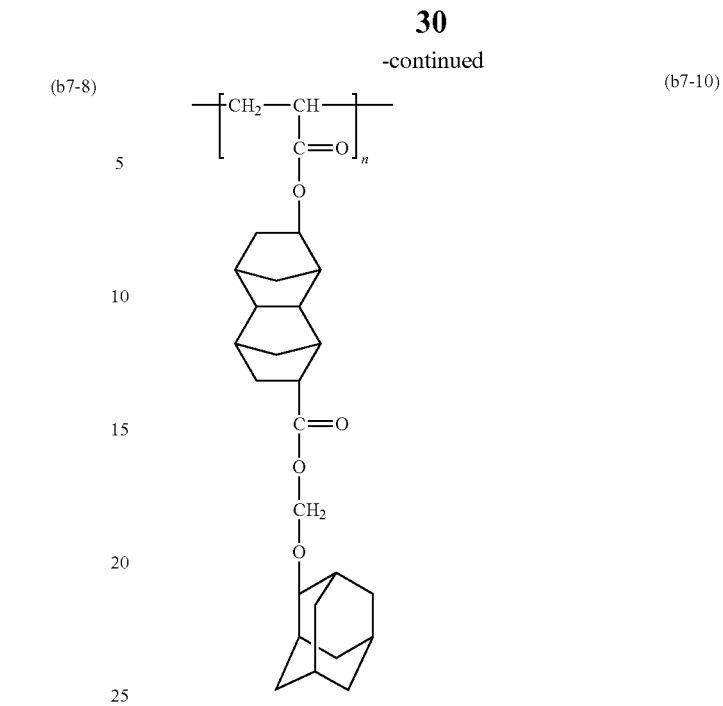
(b7-10)
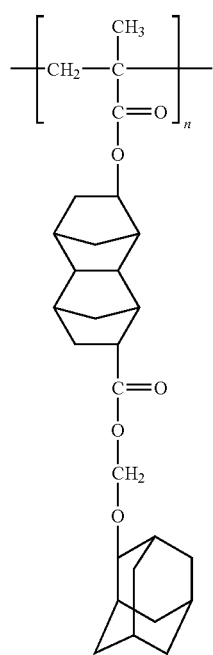
(b7-9)
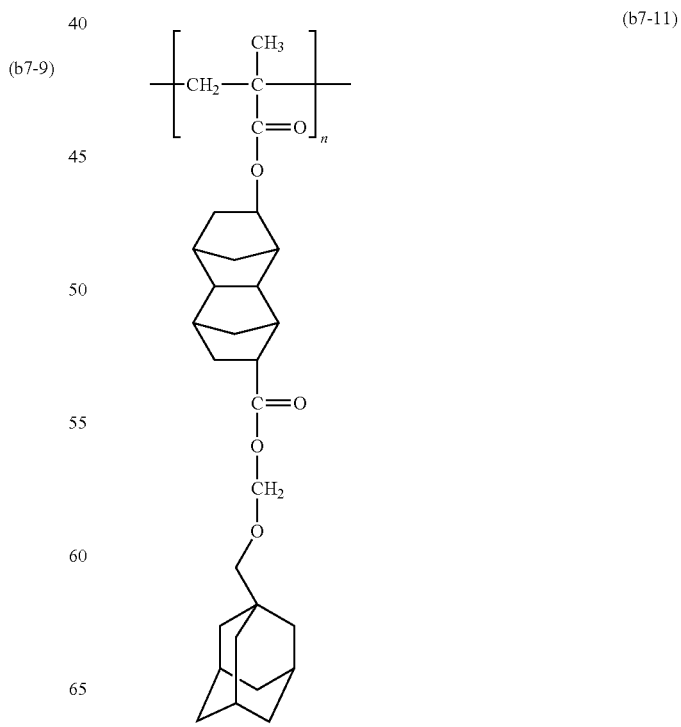
(b7-11)

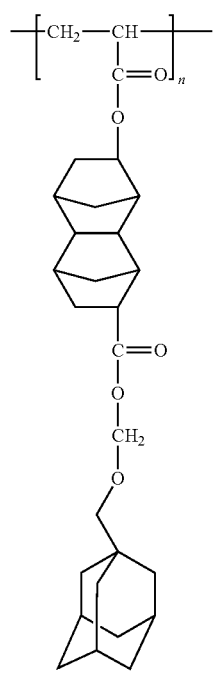
(b7-12)
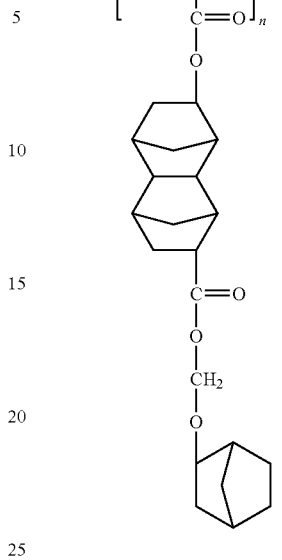
(b7-14)
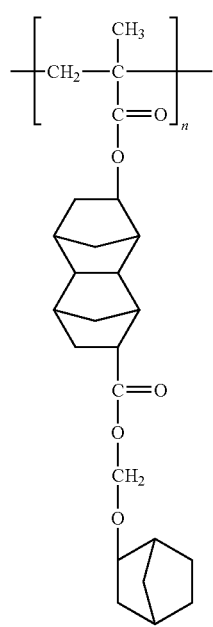
(b7-13)
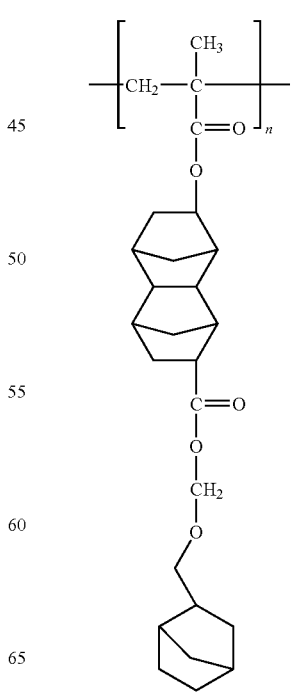
(b7-15)

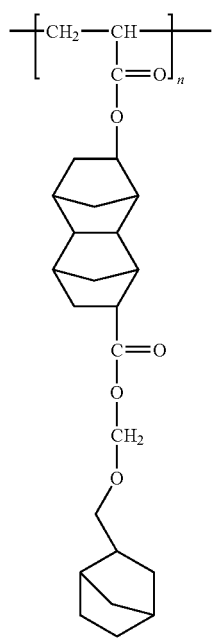 (b7-16)
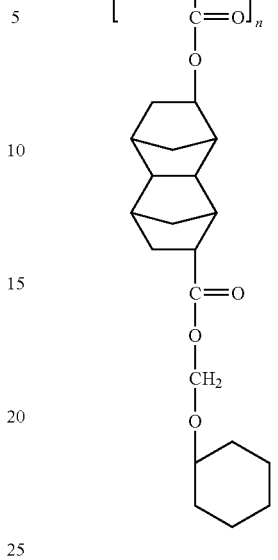 (b7-18)
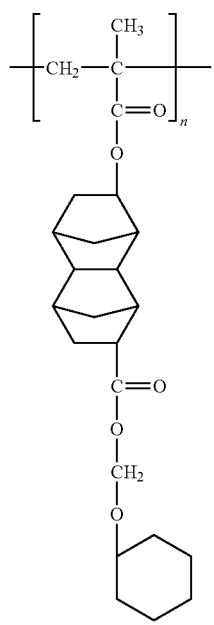 (b7-17)
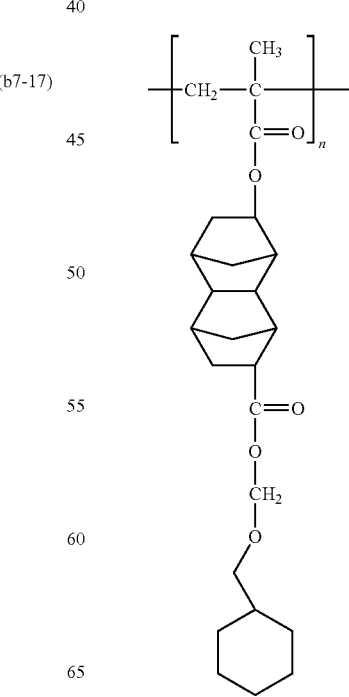 (b7-19)

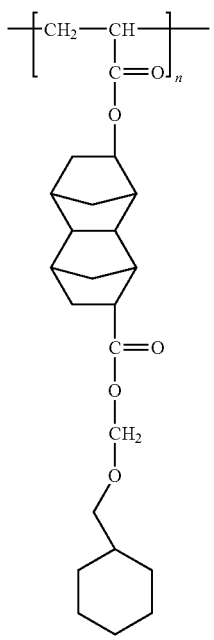

(b7-20)

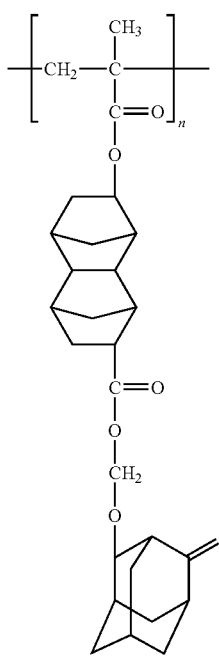

(b7-21)

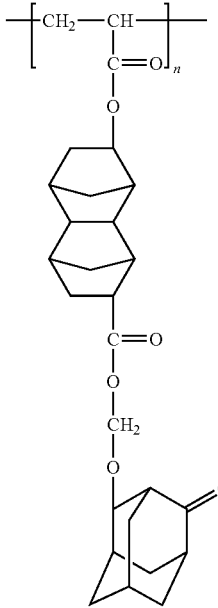

(b7-22)

It is also preferred that such an acrylic resin (B3) includes a copolymer containing a structural unit derived from a polymerizable compound additionally having an ether bond linked to the structural unit of the above general formulas (b5) to (b7).

The structural unit may be such a structural unit that is derived from a polymerizable compound having an ether bond. Examples of the polymerizable compound having an ether bond are radical polymerizable compounds like (meth) acrylic acid derivatives, having an ether bond and an ester bond, where 2-methoxyethyl(meth)acrylate, 2-ethoxyethyl (meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolypropylene glycol(meth)acrylate and tetrahydrofurfuryl (meth)acrylate; 2-methoxyethyl(meth)acrylate, 2-ethoxyethyl(meth)acrylate and methoxytriethylene glycol(meth) acrylate are preferable. These compounds may be used alone, or two or more thereof may be used in combination.

Furthermore, the acrylic resin (B3) may contain another polymerizable compound as a structural unit in order to moderately control physical and/or chemical properties. The polymerizable compound is exemplified by conventional radical polymerizable compounds and anion polymerizable compounds. Examples thereof include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl(meth)acrylate and butyl (meth)acrylate; (meth)acrylic acid hydroxyalkyl esters such as 2-hydroxyethyl(meth)acrylate and 2-hydroxypropyl (meth)acrylate; (meth)acrylic acid aryl esters such as phenyl (meth)acrylate and benzyl(meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

It is preferred in particular that the acrylic resin (B3) is a copolymer having a structural unit represented by the above general formula (b7), a structural unit derived from a polymerizable compound having an ether bond, a unit of (meth) acrylic acid, and a structural unit of a (meth)acrylic acid alkyl ester.

The copolymer is preferably one represented by the following general formula (b8).

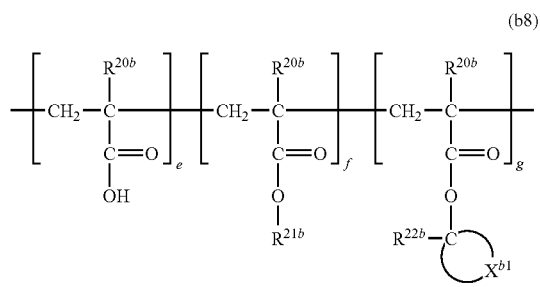

(b8)

In the above general formula (b8), $R^{20b}$ represents a hydrogen atom or a methyl group; $R^{21b}$ represents a linear or branched alkyl group or alkoxyalkyl group having 1 to 6 carbon atoms; $R^{22b}$ represents a linear or branched alkyl group having 2 to 4 carbon atoms; and $X^{b1}$ is as defined above.

In regards to the copolymers represented by the above general formula (b8), e, f and g are each mass ratios, with e being 1% to 30% by mass, f being 20% to 70% by mass and g being 20% to 70% by mass.

In addition, the polystyrene equivalent mass average molecular weight of the component (B) is preferably 10,000 to 600,000, more preferably 50,000 to 600,000, and still more preferably 230,000 to 550,000. By thus adjusting the mass average molecular weight, the resist film can maintain sufficient strength without degrading peel properties with substrates, and also swelling of profiles in the plating process, and generation of cracks can be prevented.

It is also preferred that the component (B) has a dispersivity of no less than 1.05. Dispersivity herein indicates a value of a mass average molecular weight divided by a number average molecular weight. A dispersivity in the range described above can avoid problems with respect to stress resistance on intended plating or possible swelling of metal layers resulting from the plating process.

Preferably, an amount of the component (B) is 5 to 60% by mass in the positive-type photoresist composition.

Alkali-Soluble Resin (C)

Additionally, an alkali-soluble resin may be included appropriately in the positive-type photoresist composition of this embodiment. Preferably, such a component (C) is at least one selected from alkali-soluble novolac resins (C1a), polyhydroxystyrene resins (C1b), acrylic resins (C1c) and vinyl resins (C1d).

Alkali-Soluble Novolac Resin (C1a)

Preferably, the mass average molecular mass of the alkali-soluble novolac resin (C1a) is 1,000 to 50,000 in terms of the polystyrene equivalent mass average molecular weight.

The novolac resin (C1a) may be prepared by addition condensation between, for example, aromatic compounds having a phenolic hydroxy group (hereinafter, simply referred to as "phenols") and aldehydes in the presence of an acid catalyst. Examples of phenols which may be used herein include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallic acid ester, α-naphthol and β-naphthol, and the like.

Examples of the aldehydes include formaldehyde, furfural, benzaldehyde, nitrobenzaldehyde acetaldehyde, and the like. The catalyst used in the addition condensation reaction, which is not specifically limited, is exemplified by hydrochloric acid, nitric acid, sulfuric acid, formic acid, oxalic acid and acetic acid in regards to acid catalyst.

In this embodiment, the flexibility of the resins can be enhanced still more when o-cresol is used, a hydrogen atom of a hydroxy group in the resins is substituted with other substituents, or bulky aldehydes are used.

Alkali-Soluble Polyhydroxystyrene Resin (C1b)

Preferably, the mass average molecular weight of the alkali-soluble polyhydroxystyrene resin (C1b) is 1,000 to 50,000.

The hydroxystyrene compound to constitute the polyhydroxystyrene resin (C1b) is exemplified by p-hydroxystyrene, α-methylhydroxystyrene, α-ethylhydroxystyrene, and the like. It is also preferred that the aforementioned polyhydroxystyrene resin is a copolymer with a styrene resin; and the styrene compound to constitute the styrene resin is exemplified by styrene, chlorostyrene, chloromethylstyrene, vinyltoluene, α-methylstyrene, and the like.

Alkali-Soluble Acrylic Resin (C1c)

Preferably, the mass average molecular weight of the alkali-soluble acrylic resin (C1c) is 50,000 to 800,000.

Preferably, the acrylic resin (C1c) contains a monomer derived from a polymerizable compound having an ether bond and a monomer derived from a polymerizable compound having a carboxyl group.

Examples of the polymerizable compound having an ether bond include (meth)acrylic acid derivatives, having an ether bond and an ester bond, such as 2-methoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolypropylene glycol(meth)acrylate, tetrahydrofurfuryl(meth)acrylate, and the like; and 2-methoxyethyl acrylate and methoxytriethylene glycol acrylate are preferable. These compounds may be used alone, or two or more thereof may be used in combination.

Examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester bond such as 2-methacryloyloxyethyl succinic acid, 2-methacryloyloxyethyl maleic acid, 2-methacryloyloxyethyl phthalic acid, 2-methacryloyloxyethylhexahydro phthalic acid, and the like; and acrylic acid and methacrylic acid are preferable. These compounds may be used alone, or two or more thereof may be used in combination.

Alkali-Soluble Polyvinyl Resin (C1d)

The mass average molecular weight of the alkali-soluble polyvinyl resin (C1d) is preferably 10,000 to 200,000, and more preferably 50,000 to 100,000.

The polyvinyl resin (C1d) is a poly(vinyl lower alkyl ether) and includes a (co-)polymer obtained by polymerizing one or a mixture of two or more vinyl lower alkyl ethers represented by the general formula (c1) below.

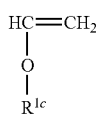

(c1)

In the above general formula (c1), $R^{1c}$ represents a linear or branched alkyl group having 1 to 6 carbon atoms.

The polyvinyl resin (C1d) is a polymer prepared from vinyl compounds; specifically, the polyvinyl resin is exemplified by polyvinyl chloride, polystyrene, polyhydroxystyrene, polyvinyl acetate, polyvinyl benzoate, polyvinyl methyl ether, polyvinyl ethyl ether, polyvinyl alcohol, polyvinyl pyrrolidone, polyvinyl phenol and copolymers thereof, and the like. Among these, polyvinyl methyl ether is preferable in view of lower glass transition temperatures.

The amount of the alkali-soluble resin (C) is preferably 5 to 95 parts by mass, and more preferably 10 to 90 parts by mass, with respect to 100 parts by mass of the component (B). Such an amount of no less than 5 parts by mass tends to be able to improve crack resistance, while an amount of no more than 95 parts by mass tends to prevent a decrease in film thickness at development.

Other Components

The positive-type photoresist composition is preferably used in a solution form in which the above-described components are dissolved in solvents. Examples of such solvents include ketones such as acetone, methyl ethyl ketone, cyclohexanone, methyl isoamyl ketone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol and dipropylene glycol monoacetate, as well as monomethyl ether, monoethyl ether, monopropyl ether, monobutyl ether or monophenyl ether thereof; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanoate, 3-methoxybutyl acetate, and 3-methyl-3-methoxybutyl acetate; and aromatic hydrocarbons such as toluene and xylene. These may be used alone, or as a mixture of two or more thereof.

The amount of the organic solvent used preferably falls within the range which gives the solid content of no less than 30% by mass such that the photoresist layer obtained using the chemically amplified positive-type photoresist composition according to this embodiment (for example, by a spin coating method) has a film thickness of no less than 1 μm.

More preferably, a photoresist layer obtained using the composition according to this embodiment has a film thickness in the range of 1 μm to 200 μm.

To the chemically amplified positive-type photoresist composition may be further added as desired miscible additives such as e.g., a supplementary resin, sensitizer, acid diffusion control agent, adhesion auxiliary agent, stabilizer, colorant, and surfactant which are commonly used for improving the resist film performance.

The organic film 12 of the negative electrode base member 10 according to this embodiment is preferably formed from a positive-type photoresist composition that contains an alkali-soluble resin as component (A2), and a quinone diazide group-containing compound as component (B2) described later, and is more preferably a patterned organic film produced by patterning to give a predetermined shape with the organic film made from the positive-type photoresist composition by pattern exposure.

Examples of the component (A2) include: novolac resins obtained by condensation reactions of phenols (e.g., phenol, m-cresol, p-cresol, xylenol, and trimethyl phenol) with aldehydes (e.g., formaldehyde, formaldehyde precursors, propionaldehyde, 2-hydroxybenzaldehyde, 3-hydroxybenzaldehyde, and 4-hydroxybenzaldehyde) and/or ketones (e.g., methyl ethyl ketone and acetone) in the presence of an acidic catalyst; hydroxystyrene resins such as homopolymers of hydroxystyrene, copolymers of hydroxystyrene with other styrene based monomer, and copolymers of hydroxystyrene with acrylic acid, methacrylic acid or a derivative thereof; acrylic resins of acrylic acid, methacrylic acid or a derivative thereof, or copolymers of the same; and the like.

Particularly, novolac resins obtained by condensation reactions of phenols including at least two selected from m-cresol, p-cresol, 3,4-xylenol and 2,3,5-trimethylphenol, with aldehydes including at least one selected from formaldehyde, 2-hydroxybenzaldehyde (salicyl aldehyde) and propionaldehyde are suitable for preparation of positive-type photoresist compositions that are superior in resolving ability with high sensitivity. The component (A5) may be produced according to a common procedure.

The component (A2) has a polystyrene equivalent mass average molecular weight (Mw) determined on gel permeation chromatography being preferably 2,000 to 100,000, and more preferably 3,000 to 30,000 in light of the sensitivity and pattern formation although it may vary depending on the type thereof.

In addition, the component (A2) is preferably a novolac resin (hereinafter, referred to as fractionated resin) subjected to a fractionating process to have Mw in the range of 3,000 to 30,000, and more preferably 5,000 to 20,000. By using such a fractionated resin as the component (A2), a positive-type photoresist composition that is superior in the heat resistance can be obtained. The fractionating processing may be carried out by, for example, a fractional precipitation treatment utilizing the dependency of molecular weight on the solubility of polymers. In the fractional precipitation treatment, for example, a novolac resin that is a condensation product obtained as described above is first dissolved in a polar solvent, and a poor solvent such as water, heptane, hexane, pentane or cyclohexane is added to the resultant solution. In this process, the low-molecular weight polymer remains dissolved in the poor solvent. Thus, the fractionated resin having a reduced content of the low-molecular weight polymer can be obtained by filtering the precipitates. Examples of the polar solvent include alcohols such as methanol and ethanol, ketones such as acetone and methyl ethyl ketone, glycol ether esters such as ethylene glycol monoethyl ether, cyclic ethers such as tetrahydrofuran, and the like.

The aforementioned component (B2) is a quinone diazide group-containing compound, and particularly preferably a reaction product (nonbenzophenone based PAC) of esterification of a 1,2-naphthoquinone diazidesulfonyl compound with a compound represented by the following general formula (b2a):

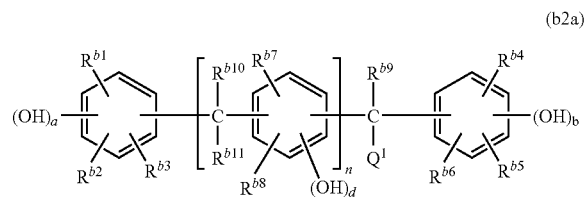

[in the above general formula (b2a), $R^{b1}$ to $R^{b8}$ each independently represent a hydrogen atom, halogen atom, an alkyl group having 1 to 6 carbon atoms, an alkoxy group having 1 to 6 carbon atoms, or a cycloalkyl group having 3 to 6 carbon atoms; $R^{b10}$ and $R^{b11}$ each independently represent a hydrogen atom, or an alkyl group having 1 to 6 carbon atoms; provided that $R^{b9}$ is a hydrogen atom or an alkyl group having 1 to 6 carbon atoms, $Q^1$ represents a hydrogen atom, an alkyl group having 1 to 6 carbon atoms, or a residue represented by the following chemical formula (b2b):

[in the above general formula (b2b), $R^{b12}$ and $R^{b13}$ each independently represent a hydrogen atom, a halogen atom, an alkyl group having 1 to 6 carbon atoms, an alkoxy group having 1 to 6 carbon atoms, or a cycloalkyl group having 3 to 6 carbon atoms; and c represents an integer of 1 to 3.]; when $Q^1$ bonds to the terminal of $R^{b9}$, $Q^1$ forms a cycloalkylene chain having 3 to 6 carbon atoms together with $R^{b9}$, and a carbon atom between $Q^1$ and $R^{b9}$; a and b represent an integer of 1 to 3; d represents an integer of 0 to 3; and n represents an integer of 0 to 3.], in light of high sensitivity, excellent resolving ability even under low-NA conditions, as well as mask linearity and DOF.

Examples of preferable phenol compound represented by the above general formula (b2a) include:

[1] trisphenolic compounds in which: $Q^1$ does not bond to the terminal of $R^{b9}$; $R^{b9}$ represents a hydrogen atom or an alkyl group having 1 to 6 carbon atoms; $Q^1$ represents a reside represented by the above chemical formula (b2); and n represents 0, and

[2] linear polyphenol compounds in which $Q^1$ does not bond to the terminal of $R^{b9}$; $R^{b9}$ represents a hydrogen atom or an alkyl group having 1 to 6 carbon atoms; $Q^1$ represents a hydrogen atom or an alkyl group having 1 to 6 carbon atoms; and n represents an integer of 1 to 3.

More specific examples of the trisphenolic compound include tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3,4-dihydroxyphenylmethane, and the like.

More specific examples of the linear polyphenol compound include: linear trinuclear phenol compounds such as 2,4-bis(3,5-dimethyl-4-hydroxybenzyl)-5-hydroxyphenol and 2,6-bis(2,5-dimethyl-4-hydroxybenzyl)-4-methylphenol; linear tetranuclear phenol compounds such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethyl-phenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane and bis[2,5-dimethyl-3-(2-hydroxy-5-methylbenzyl)-4-hydroxyphenyl]methane; linear pentanuclear phenol compounds such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and 2,6-bis[2,5-dimethyl-3-(2-hydroxy-5-methylbenzyl)-4-hydroxybenzyl]-4-methylphenol, and the like.

Moreover, examples of the phenol compound represented by the general formula (b1) other than the trisphenolic compounds and linear polyphenol compounds include: bisphenolic compounds such as bis(2,3,4-trihydroxyphenyl)methane, bis(2,4-dihydroxyphenyl)methane, 2,3,4-trihydroxyphenyl-4'-hydroxyphenyl-methane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl) propane, 2-(2,4-dihydroxyphenyl)-2-(4'-hydroxyphenyl) propane, 2-(2,3,4-trihydroxyphenyl)-2-(4'-hydroxyphenyl) propane and 2-(2,3,4-trihydroxyphenyl)-2-(4'-hydroxy-3',5'-dimethylphenyl)propane; polynuclear branched compounds such as 1-[1-(4-hydroxyphenyl)isopropyl]-4-[1,1-bis(4-hydroxyphenyl)ethyl]benzene and 1-[1-(3-methyl-4-hydroxyphenyl)isopropyl]-4-[1,1-bis(3-methyl-4-hydroxyphenyl) ethyl]benzene; condensed phenol compounds such as 1,1-bis (4-hydroxyphenyl)cyclohexane, and the like. These phenol compounds may be used alone, or in combination of two or more thereof.

Among such components (B2), the trisphenolic compounds are particularly preferred, and photoresist compositions that contain a naphthoquinone diazide esterified product such as a trisphenolic compound of bis(5-cyclohexyl-4-hydroxy-2-methylphenyl)-3,4-dihydroxyphenylmethane [hereinafter, abbreviated as (B2a)] or bis(4-hydroxy-2,3,5-trimethylphenyl)-2-hydroxyphenylmethane [hereinafter, abbreviated as (B2c)] are preferable due to favorable sensitivity and also resolving ability. Furthermore, to use, together with the naphthoquinone diazide esterified product of the trisphenolic compound, a naphthoquinone diazide esterified product of other phenol compound, i.e., a naphthoquinone diazide esterified product of the phenol compound such as the aforementioned bisphenolic compound, polynuclear branched compound, and condensed phenol compound is preferred since a resist composition that is excellent in total balance of resist characteristics such as resolving ability, sensitivity, heat resistance, DOF characteristics and mask linearity can be prepared. In particular, the bisphenolic compounds are preferred, and among them, bis(2,4-dihydroxyphenyl)methane [hereinafter, abbreviated as (B2b)] is preferred. The positive-type photoresist composition containing the naphthoquinone diazide esterified product of three types of the aforementioned phenol compounds (B2a), (B2c) and (B2b) is preferred since a resist pattern having a favorable shape can be formed with high sensitivity and high resolving ability.

When (B2a) or (B2c) is used, the amount in the component (B2) is each preferably no less than 10% by mass, and more preferably no less than 15% by mass in the entire component (B2). In addition, when (B2a), (B2b) and (B2c) are all used, each amount is in light of the effect, 50 to 90% by mass and preferably 60 to 80% by mass of (B2a), 5 to 20% by mass and preferably 10 to 15% by mass of (B2b), and 5 to 20% by mass and preferably 10 to 15% by mass of (B2c) in the entirety of the component (B2).

The method for naphthoquinone diazide sulfonic esterification of all or a part of the phenolic hydroxy groups of the compound represented by the above general formula (b2a) can be carried out according to a common procedure. For example, naphthoquinone diazide sulfonyl chloride may be condensed with the compound represented by the above general formula (b2a) to obtain an intended product. Specifically, for example, the compound represented by the above general formula (b2a) and naphthoquinone-1,2-diazido-4(or 5)-sulfonyl chloride in certain amounts are dissolved in an organic solvent such as dioxane, n-methylpyrrolidone, dimethyl acetamide or tetrahydrofuran, and the reaction is allowed to proceed by adding thereto one or more of basic catalysts such as triethylamine, triethanolamine, pyridine, alkaline carbonate and alkaline bicarbonate, and thus resulting product is washed with water followed by drying thereby capable of preparing an intended product.

As the component (B2), in addition to the exemplified preferable naphthoquinone diazide esterified products as described above, other naphthoquinone diazide esterified product may be also used. For example, reaction products of esterification of a phenol compound such as polyhydroxybenzophenone or alkyl gallate with a naphthoquinone diazide sulfonic acid compound, and the like can be also used. The amount of the other naphthoquinone diazide esterified products used may be no greater than 80% by mass, and particularly no greater than 50% by mass in the component (B2).

The amount of the component (B2) in the positive-type photoresist composition is 20 to 70% by mass, and preferably 25 to 60% by mass with respect to total amount including the component (A2), and the component (C) blended arbitrarily. The amount of the component (B2) being not below the above lower limit leads to an image with fidelity to the pattern, and improvement of transferring performance. The amount not exceeding the above upper limit enables deterioration of the sensitivity to be prevented, thereby achieving the effect of improving uniformity of the formed resist film, and also improving resolving ability.

In addition to the aforementioned component (A2) and component (B2), a phenolic hydroxy group-containing compound having a molecular weight of no greater than 1,000 as component (C2) that is a sensitizer may be further blended in such a positive-type photoresist composition. This component (C2) has an excellent effect of improving the sensitivity, and thus, a material exhibiting high sensitivity and high resolution, and being superior in mask linearity can be obtained even under low NA conditions by using the component (C2). The component (C2) has a molecular weight of no greater than 1,000, preferably no greater than 700, and substantially no less than 200 and preferably no less than 300.

Such a component (C2) is not particularly limited as long as it is a phenolic hydroxy group-containing compound generally used in photoresist compositions as a sensitivity improver or sensitizer, and preferably satisfies the aforementioned requirements for the molecular weight. The component may be used alone, or two or more thereof may be used by selecting appropriately. Among all, phenol compounds represented by the following general formula (c2a):

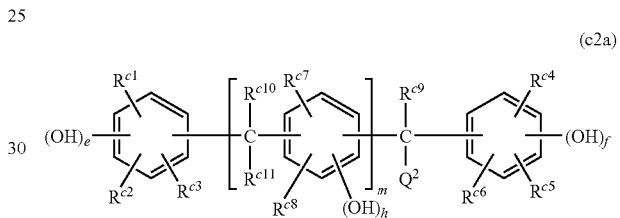

(c2a)

[where, $R^{c1}$ to $R^{c8}$ each independently represent a hydrogen atom, a halogen atom, an alkyl group having 1 to 6 carbon atoms, an alkoxy group having 1 to 6 carbon atoms, or a cycloalkyl group having 3 to 6 carbon atoms; $R^{c10}$ and $R^{c11}$ each independently represent a hydrogen atom or an alkyl group having 1 to 6 carbon atoms; when $R^{c9}$ is a hydrogen atom or an alkyl group having 1 to 6 carbon atoms, $Q^2$ is a hydrogen atom, an alkyl group having 1 to 6 carbon atoms, or a residue represented by the following chemical formula (c2b):

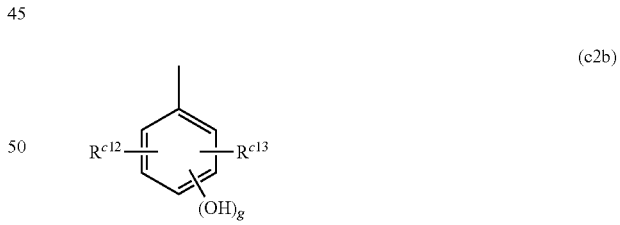

(c2b)

[where, $R^{c12}$ and $R^{c13}$ each independently represent a hydrogen atom, a halogen atom, an alkyl group having 1 to 6 carbon atoms, an alkoxy group having 1 to 6 carbon atoms, or a cycloalkyl group having 3 to 6 carbon atoms; and g represents an integer of 0 to 3.] when $Q^2$ bonds to the terminal of $R^{c9}$, $Q^2$ represents a cycloalkylene chain having 3 to 6 carbon atoms together with $R^{c9}$, and a carbon atom between $Q^2$ and $R^{c9}$; e and f represent an integer of 1 to 3; h represents an integer of 0 to 3; and m represents an integer of 0 to 3] are preferred.

Specific examples which can be suitably used include phenol compounds used in naphthoquinone diazide esterified products of phenol compounds exemplified for the component (B2) described above, as well as trisphenyl type compounds such as bis(3-methyl-4-hydroxyphenyl)-4-isopropylphenylmethane, bis(3-methyl-4-hydroxyphenyl)-phenylmethane, bis(2-methyl-4-hydroxyphenyl)-phenylmethane, bis(3-methyl-2-hydroxyphenyl)-phenylmethane, bis(3,5-dimethyl-4-hydroxyphenyl)-phenylmethane, bis(3-ethyl-4-hydroxyphenyl)-phenylmethane, bis(2-methyl-4-hydroxyphenyl)-phenylmethane, and bis(2-tert-butyl-4,5-dihydroxyphenyl)-phenylmethane. Of these, bis(2-methyl-4-hydroxyphenyl)-phenylmethane, and 1-[1-(4-hydroxyphenyl)isopropyl]-4-[1,1-bis(4-hydroxyphenyl)ethyl]benzene are preferred.

The amount of the component (C2) may fall within the range of 10 to 70% by mass, and preferably 20 to 60% by mass based on the aforementioned component (A2).

In addition, it is preferred that the positive-type photoresist composition contains an organic solvent. The organic solvent is not particularly limited, and those commonly used in photoresist compositions may be used alone, or two or more thereof may be used by selecting appropriately. Specific examples of such organic solvents include ketones such as acetone, methyl ethyl ketone, cyclohexanone, methyl isoamyl ketone, and 2-heptanone; polyhydric alcohols and derivatives thereof such as ethylene glycol, propylene glycol, diethylene glycol, ethylene glycol monoacetate, propylene glycol monoacetate, diethylene glycol monoacetate, or monomethyl ether thereof, monoethyl ether thereof, monopropyl ether thereof, monobutyl ether thereof or monophenyl ether thereof; cyclic ethers such as dioxane; and esters such as methyl acetate, ethyl acetate, butyl acetate, ethyl lactate, methyl pyruvate, ethyl pyruvate, methyl methoxypropionate, and ethyl ethoxypropionate, γ-butyrolactone, and the like.

It is preferred to use at least one organic solvent selected from propylene glycol monomethyl ether, propylene glycol monobutyl ether, propylene glycol monomethyl ether acetate, 2-heptanone, methyl lactate, ethyl lactate, and γ-butyrolactone among the organic solvents described above. When such a solvent is used, it is desired that the solvent be included in an amount of no greater than 50% by mass in the entire organic solvent.

To the positive-type photoresist composition may be further added as desired commonly used compatible additives in the range not to impair the object of the present invention such as e.g., supplementary resins, plasticizers, preservation stabilizers and surfactants which are commonly used to improve the resist film performance, etc., coloring agents for use in further enhancing visibility of the developed image, sensitizers for use in further improving the sensitizing effects, as well as antihalation dyes, adhesiveness improvers, and the like.

As the antihalation dye, an ultraviolet ray absorbing agent (for example, 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene, curcumin etc.) and the like may be used.

The surfactant may be added, for example, in order to prevent striation etc., and fluorochemical surfactants such as Flolade FC-430, FC431 (trade name, manufactured by Sumitomo 3M Ltd.), and EFTOP EF122A, EF122B, EF122C, EF126 (trade name, manufactured by Tochem Products Co., Ltd.), XR-104, Megafac R-08 (trade name, manufactured by Dainippon Ink And Chemicals, Incorporated), for example, can be used.

Patterned Organic Film

The organic film 12 may be formed by coating the positive-type photoresist composition on the support 11 using a spin coater. Furthermore, after such organic film 12 is coated on the support 11, image exposure is conducted by irradiating an actinic ray or radiation such as an ultraviolet ray, excimer laser, X-ray, electronic beam or the like through a mask, and then a heat treatment is carried out if necessary. Thereafter, a development process is conducted with an alkali developing solution to dissolve and remove the unirradiated region, and a heat treatment is carried out if necessary, whereby a patterned organic film results.

It is preferred that the aspect ratio of the patterned organic film obtained as described above be no less than 0.1. When the aspect ratio of the patterned organic film is no less than 0.1, the surface area of the negative electrode base member 10 increases, whereby the amount of the metal film formed by a plating process described later can increase. Consequently, an additionally higher output voltage and higher energy density can be achieved.

Negative-Type Photoresist Composition

On the other hand, a negative-type photoresist composition which contains an acid generator component capable of producing an acid upon being irradiated with an actinic ray or radiation (the same as the aforementioned component (A)), and a polyfunctional epoxy resin (hereinafter, referred to as component (D)) as essential components may be preferably used. When component (D) is used in combination with the acid generator, exposed regions become alkali-insoluble since the regions undergo cation polymerization by action of an acid produced at the regions, and thus unexposed regions are selectively removed upon development to produce a photoresist pattern having a predetermined shape.

Polyfunctional Epoxy Resin (D)

Although the polyfunctional epoxy resin (D) is not particularly limited, it is preferably an epoxy resin having sufficient epoxy groups per molecule so as to form a pattern of a thick film. Examples of the polyfunctional epoxy resin include polyfunctional phenol novolac type epoxy resins, polyfunctional orthocresol novolac type epoxy resins, polyfunctional triphenyl type novolac type epoxy resins, polyfunctional bisphenol A novolac type epoxy resin, and the like. Among these, polyfunctional bisphenol A novolac type epoxy resins are preferably used. Preferably, the functionality is at least five; commercially available examples thereof are "Epicoat 157S70" manufactured by Japan Epoxy Resins Co., Ltd., "Epichron N-775" manufactured by Dainippon Ink And Chemicals, Incorporated, which are preferably used in particular.

The polyfunctional bisphenol A novolac type epoxy resins are represented by the following general formula (d1):

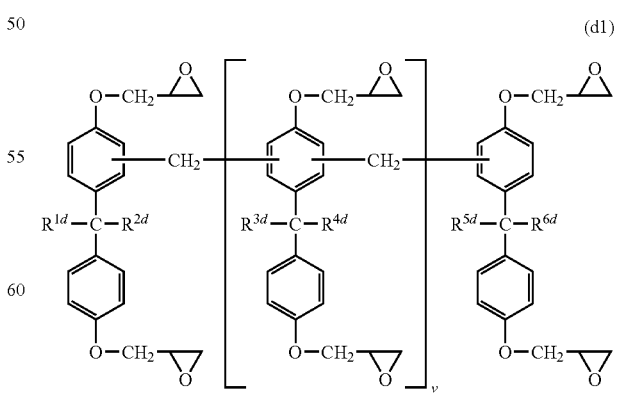

The epoxy group in the bisphenol A novolac type epoxy resin represented by the above formula (d1) may be a polymer that is polymerized with a bisphenol A type epoxy resin or a bisphenol A novolac type epoxy resin. In the above formula (d1), $R^{1d}$ to $R^{6d}$ are H or $CH_3$, and v represents repeating units.

Preferably, the content of the polyfunctional epoxy resin is preferably 80% by mass to 99.9% by mass, and more preferably 92% by mass to 99.4% by mass based on the photoresist composition. Consequently, the photoresist film is obtained with higher sensitivity and appropriate hardness when coated on the support 11.

Acid Generator Component (A)

The acid generator component (A) may be similar to the acid generator used in the positive-type resin composition described above. The acid generator component (A) produces a cation component upon being irradiated with an actinic ray or radiation and the cation component acts as a polymerization initiator.

The component (A) may be used alone, or in combination of two or more thereof. The content of the component (A) is preferably 0.5 to 20 parts by mass, with respect to 100 parts by mass of the above polyfunctional epoxy resin. By adjusting the content of the component (A) to fall within the above range, long-term film characteristics can be maintained while keeping sufficient sensitivity.

Other Component

In the negative-type photoresist composition, a conventionally well-known solvent component is used similarly to the positive-type photoresist composition. Moreover, lactone-based solvents such as γ-butyrolactone, β-propiolactone, γ-valerolactone, δ-valerolactone, γ-caprolactone and ε-caprolactone are preferably used since ring opening of lactone caused upon the heat treatment in forming the photoresist pattern allows for a reaction with the functional group of the polymer, and they are consequently incorporated in the photoresist film. Hydroxycarboxylate ester-based solvents such as alkyl glycolate ester, alkyl lactate ester, and alkyl 2-hydroxybutyrate ester are preferably used since they have properties to improve coatability and leveling performances.

In the negative-type photoresist composition, an aromatic polycyclic compound which is crosslinkable with the aforementioned polyfunctional epoxy resin and has at least two substituents may be used as a sensitizer. The sensitization action of such an aromatic polycyclic compound can enhance the photoresist composition to have a higher sensitivity. Specifically, aromatic polycyclic compounds having two or more hydroxy groups, carboxyl groups, and amino groups etc., such as naphthalene compounds, dinaphthalene compounds, anthracene compounds, and phenanthroline compounds are preferably used. Among these, naphthalene compounds are more preferred, and particularly 1,5-dihydroxynaphthalene, 2,3-dihydroxynaphthalene, and 2,6-dihydroxynaphthalene are preferably used in light of improvement of crosslinking efficiency.

Additionally, the negative-type photoresist composition may also contain a linear polymeric bifunctional epoxy resin for improving film forming properties. From the standpoint of improving flexibility of the resist composition before curing without deteriorating the properties after curing, oxetane derivatives and epoxy derivatives may be contained. In addition, conventionally well-known agents of miscible additives, for example, supplementary resins, plasticizers, stabilizers, coloring agents, surfactants, coupling agents, and the like for improving patterning efficiency can be appropriately contained, if desired.

Photoresist Pattern

A method for forming a resist pattern in which any conventional positive-type resist composition or negative-type resist composition is used, for example, is applicable to the positive-type and the negative-type photoresist compositions which may be used in this embodiment. Specifically, the photoresist composition prepared in a solution form is coated on the support 11 using a spin coater or the like, followed by prebaking to form a photoresist film. Alternatively, a photoresist film may be formed by a procedure in which both faces are protected with a protective film to give a dry film, which is then affixed to the support 11. When a dry film is provided, coating and drying on the support 11 can be omitted, thereby allowing a photoresist pattern to be produced in a more simplified manner.

Subsequently, the photoresist film is subjected to a selective exposure process. In the exposure process, g-, h-, i-rays, KrF excimer laser beams, ArF excimer laser beams, $F_2$ excimer laser beams, EUV (Extreme ultraviolet rays), electronic beams (EB), soft X-rays, X-rays and the like can be used, which may be irradiated through a desired mask pattern, or direct writing may be conducted. Preferably, KrF excimer laser beams may be used. Subsequently, a heat treatment following the exposure (post exposure baking, hereinafter, may be also referred to as "PEB") is carried out. After the PEB process, a development process is carried out using a developing solution such as an aqueous alkaline solution, followed by subjecting to processes such as washing water and drying as needed, whereby a photoresist pattern is produced. The developing solution is not particularly limited, and a conventionally well-known aqueous alkaline solution or the like may be used.

The heating temperature in prebaking, and the heating temperature in post exposure baking (PEB) may be 70 to 160° C., and preferably 100 to 150° C. The baking time period may be set to fall in the range of 40 to 180 sec, and preferably 60 to 90 sec. Moreover, the method may optionally include a post-baking step after the alkaline development.

It is preferred that the aspect ratio of the photoresist pattern be no less than 0.1. When the aspect ratio of the photoresist pattern is no less than 0.1, the surface area of the negative electrode base member 10 increases, whereby the amount of the metal film formed by a plating process described later can increase. Consequently, an additionally higher output voltage and higher energy density can be achieved.

Metal Film

The metal film of the negative electrode base member according to this embodiment is preferably formed by a plating process, but is not limited in particular. As the plating process, a conventionally well-known technique may be employed, and is not particularly limited as long as the metal film can be formed on the aforementioned organic film, composite film, silica coating, or the organic film having the metal oxide film on the surface layer. In addition, the metal film may be composed of multiple layers formed by a multistep plating process. The step of forming such metal film, i.e., the plating process step, preferably includes: a washing step; a catalyzing treatment step, followed by an electroless nickel plating or electroless copper plating step; and further an electroless tin plating step, or an electrolytic tin plating step.

The plating process which is suitable in this embodiment is specifically explained below.

Washing Step

The support having the organic film, the composite film, the silica coating or the organic film covered with the metal oxide film on the surface layer is first washed by immersing in a phosphoric acid based solution. Sodium phosphate or the like may be used in the phosphoric acid based solution. The immersing time period is preferably 30 to 180 sec, and more preferably 45 to 90 sec.

Catalyzing Step

The support following the aforementioned washing step is immersed in an aqueous tin chloride ($SnCl_2$) solution having a certain concentration for a predetermined time. The concentration of tin chloride is preferably 0.01 $g/dm^3$ to 0.10 $g/dm^3$, and more preferably 0.03 $g/dm^3$ to 0.07 $g/dm^3$. Furthermore, the immersion time period is preferably 15 to 180 sec, and more preferably 30 to 60 sec.

Next, the support immersed in the aqueous tin chloride ($SnCl_2$) solution for a predetermined time period is immersed in an aqueous solution of palladium chloride ($PdCl_2$) having a certain concentration for a predetermined time period. The concentration of palladium chloride is preferably 0.01 $g/dm^3$ to 0.3 $g/dm^3$, and more preferably 0.03 $g/dm^3$ to 0.07 $g/dm^3$. Furthermore, the immersion time period is preferably 15 to 180 sec, and more preferably 30 to 60 sec.

Electroless Nickel Plating Step

The support following the catalyzing step is subjected to nickel plating by immersing in a nickel plating bath. As the nickel plating bath, a conventionally well-known one may be used. For example, a nickel plating bath including 0.05 M to 0.20 M nickel sulfate, 0.10 M to 0.30 M sodium hypophosphite, a 0.05 ppm to 0.30 ppm lead ion, and a 0.05 M to 0.30 M complexing agent may be exemplified. As the complexing agent, a complexing agent of a carboxylic acid is preferably used. The temperature of the nickel plating bath is preferably 50° C. to 70° C., and the pH is preferably 4.0 to 5.5. For adjusting the pH, sodium hydroxide or sulfuric acid may be used.

In place of the electroless nickel plating, electroless copper plating may be also performed. As a copper plating bath, a conventionally well-known one may be used.

Electroless Copper Plating Step

The support following the catalyzing step is subjected to copper plating by immersing in a copper plating bath. As a copper plating bath, a conventionally well-known one may be used. For example, a copper plating bath including 0.02 M to 0.10 M copper sulfate, 0.10 M to 0.40 M formalin, 1.0 ppm to 20.0 ppm 2,2'-bipyridyl, a 50.0 ppm to 500 ppm surfactant (polyethylene glycol or the like), and a 0.20 M to 0.40 M complexing agent may be exemplified. As the complexing agent, an ethylene-amine based complexing agent is preferably used. The temperature of the copper plating bath is preferably 50° C. to 70° C., and the pH is preferably 11.5 to 12.5. Also, it is preferable to carry out stirring by aeration. For adjusting the pH, potassium hydroxide or sulfuric acid may be used.

Electroless Tin Plating Step

The support following the electroless nickel plating, or electroless copper plating step is subjected to tin plating by immersing in a tin plating bath to form a metal film on the organic film, the composite film, the silica coating or the organic film covered with the metal oxide film on the surface layer. As the tin plating bath, a conventionally well-known one may be used. For example, a tin plating bath including 0.02 M to 0.20 M tin chloride, a 0.02 M to 0.08 M reducing agent such as titanium trichloride, and a 0.10 M to 0.50 M complexing agent such as trisodium citrate, disodium ethylenediamine tetraacetate (EDTA-2Na), and nitrilotriacetic acid (NTA) may be exemplified. The temperature of the tin plating bath is preferably 45° C. to 70° C., and the pH is preferably 6.5 to 8.5. For adjusting the pH, sodium carbonate, or ammonia and hydrochloric acid may be used. It is preferred that the tin plating process be performed in a nitrogen atmosphere.

Electrolytic Tin Plating Step

In place of the electroless tin plating, electrolytic tin plating may be also performed. According to such a tin plating step, the support following the electroless nickel plating, or electroless copper plating step is subjected to electrolytic tin plating by immersing in a tin plating bath and applying a current to form a metal film on the organic film, the composite film, the silica coating or the organic film covered with the metal oxide film on the surface layer. As the electrolytic tin plating bath, a conventionally well-known one may be used. For example, a plating liquid commercially available from Leybold Co., Ltd., i.e., Starter Kurumo tin plating bath may be exemplified. The temperature of the tin plating bath is preferably 10° C. to 28° C., and the pH is preferably 1.0 to 1.5. Also, the current density which may be applied is preferably 0.5 $A/dm^2$ to 6.0 $A/dm^2$.

Secondary Cell

The negative electrode base member is suitably used as a negative electrode base member for secondary cells, and particularly as a negative electrode base member for lithium secondary cells. In lithium secondary cells, an organic solvent and a lithium salt are used as an electrolyte, whereby charging and discharging is performed by acceptance and donation of the electric charge resulting from transfer of the lithium ion ($Li^+$) between the negative electrode and positive electrode. Thus, it is advantageous in having a high output voltage, and a high energy density. In conventional lithium secondary cells, carbon is used as a negative electrode, while a transition metal oxide lithium compound is used as a positive electrode, in general. However, in recent years the investigation of negative electrode materials that provide additionally higher output and higher energy density has progressed. The negative electrode material is necessarily capable of forming a thin film, and capable of storing and releasing lithium reversibly. The aforementioned negative electrode base member can be suitably used since it fulfills these requirements. The term "storage" referred to herein means to reversibly include lithium within, to form an alloy, a solid solution or the like with lithium reversibly, and to make a chemical bond with lithium reversibly.

When the negative electrode base member is used as a negative electrode material of lithium secondary cells, it is necessary to laminate the negative electrode base member on a collector to form a negative electrode. However, when the support has conductivity, such lamination is not required, and the support itself can serve as a collector. The collector is acceptable as long as it has conductivity, and the materials and the structure thereof are not limited in particular. Collectors conventionally used in general lithium secondary cells may be employed. Preferably, the collector exhibits favorable adhesion with the negative electrode base member. Also, it is preferred that the material does not alloy with lithium. Specific examples of the material include those containing at least one element selected from the group consisting of copper, nickel, stainless steel, molybdenum, tungsten, titanium and tantalum. Furthermore, structures such as a metal foil, a non-woven fabric, and a metal collector having a three-dimensional structure are preferable. Particularly, a metal foil is preferably used, and more specifically, a copper foil is preferably used. The thickness of the collector is not particularly limited.

In general, according to a negative electrode formed by laminating a negative electrode material layer in the form of a thin film on a collector, internal resistance can be reduced as compared with negative electrodes formed by laminating a negative electrode material in the form of particles together with a binding agent and the like. In other words, the negative electrode formed by laminating the negative electrode base member on a collector can yield a lithium secondary cell having a high electric generating capacity. However, in the negative electrode formed by laminating the negative electrode material layer in the form of a thin film on a collector, adhesion of the negative electrode material layer with the collector becomes so great that deformation such as shriveling may result on the negative electrode material layer or the collector upon expansion/contraction of the negative electrode material layer resulting from charging and discharging. In particular, when a metal foil that is highly ductile such as a copper foil is used as a collector, the extent of deformation is likely to increase. Thus, the energy density of a battery is lowered, whereby the charge and discharge cycle characteristics can be deteriorated by merely laminating on a collector a negative electrode material layer in the form of a thin film.

In contrast, since the negative electrode base member according to this embodiment has a structure in which the metal film is laminated on an organic film, a composite film, a silica coating or an organic film having a metal oxide film on the surface layer, the stress generated by expansion/contraction of the metal film resulting from storage/release of the lithium may relax due to a buffer action of the organic film alone, the composite film, the silica coating, the organic film or the metal oxide film. Therefore, as a result of the capability of suppressing an increase in the stress generated upon charge and discharge, occurrence of deformation such as shriveling can be suppressed in the negative electrode base member and the collector. In turn, cracking of negative electrode base member, and detachment from the collector can be suppressed. In other words, the negative electrode formed by laminating the negative electrode base member on a collector can yield a lithium secondary cell having a high output voltage and a high energy density, and being superior in charge and discharge cycle characteristics.

The construction of the cell, but not that of the negative electrode, is not particularly limited, and may have a construction similar to those of conventionally well-known lithium secondary cells. Specifically, the cell is predominantly constructed with a positive electrode which can store/release lithium reversibly, and an electrolyte having lithium conductivity. The electrolyte is held by a separator as need, and is brought into contact with the negative electrode and the positive electrode in the state held by the separator, whereby exchange of lithium is performed.

The positive electrode is not particularly limited as long as it can store/release lithium reversibly, and the positive electrode generally employed in lithium secondary cells may be used. Specifically, the positive electrode formed by laminating a positive electrode material layer on a collector may be used. For example, the positive electrode may be formed by: dispersing a positive electrode material and a conductive agent, and a binding agent in a dispersion solvent to give a slurry; applying the slurry on a collector; and thereafter drying. The thickness of the collector and the positive electrode material layer is not particularly limited, and may be predetermined appropriately depending on the battery design capacity, and the like.

Also, the positive electrode material is not particularly limited, and a conventionally well-known material such as oxides including lithium and a transition element can be used. More specifically, $LiCoO_2$, $LiNiO_2$, $LiMnO_2$, $LiMn_2O_4$, $LiCo_{0.5}Ni_{0.5}O_2$ or the like may be used. The conductive material is not particularly limited as long as it has electric conductivity, and for example, acetylene black, carbon black, graphite powder or the like may be used. The binding agent is not particularly limited as long as it enables the shape of the positive electrode material layer to be retained after forming the positive electrode, and a rubber based binding agent or a resin based binding agent such as a fluorocarbon resin may be used.

The separator is acceptable as long as it can hold the electrolyte having lithium conductivity, and can keep electric insulation between the positive electrode and the negative electrode, with the material, the structure and the like of the separator not being limited in particular. For example, a porous resin thin film such as a porous polypropylene thin film or a porous polyethylene thin film, or a resin nonwoven fabric including polyolefin or the like may be used.

The electrolyte is not particularly limited as long as it has lithium conductivity. For example, a nonaqueous electrolyte solution prepared by dissolving in a nonaqueous solvent an electrolyte containing lithium may be used. As the electrolyte containing lithium, for example, a lithium salt such as $LiPF_6$, $LiBF_4$, $LiClO_4$, $LiAsF_6$, or $LiCF_3SO_3$ may be used. Examples of the nonaqueous solvent which may be used include e.g., propylene carbonate, ethylene carbonate, dimethyl carbonate, methylethyl carbonate, diethyl carbonate, γ-butyrolactone, 1,2-dimethoxyethane, 1,2-diethoxyethane, ethoxymethoxyethane and the like, and mixed solvents of these nonaqueous solvents. The concentration of the nonaqueous electrolyte solution is not particularly limited, and a polymer electrolyte, a solid electrolyte, generally referred to, or the like may be used.

The lithium secondary cell in which the negative electrode base member according to this embodiment is used as a negative electrode may have a variety of battery shapes such as a coin shape, a cylindrical shape, a square shape and a plane shape. Also, the capacity is not particularly limited, and thus the lithium secondary cell of the present invention is applicable to any battery including from minute batteries used in precision instruments and the like to large-sized batteries used in hybrid cars and the like.

Second Embodiment

Negative Electrode Base Member

Figure 2:
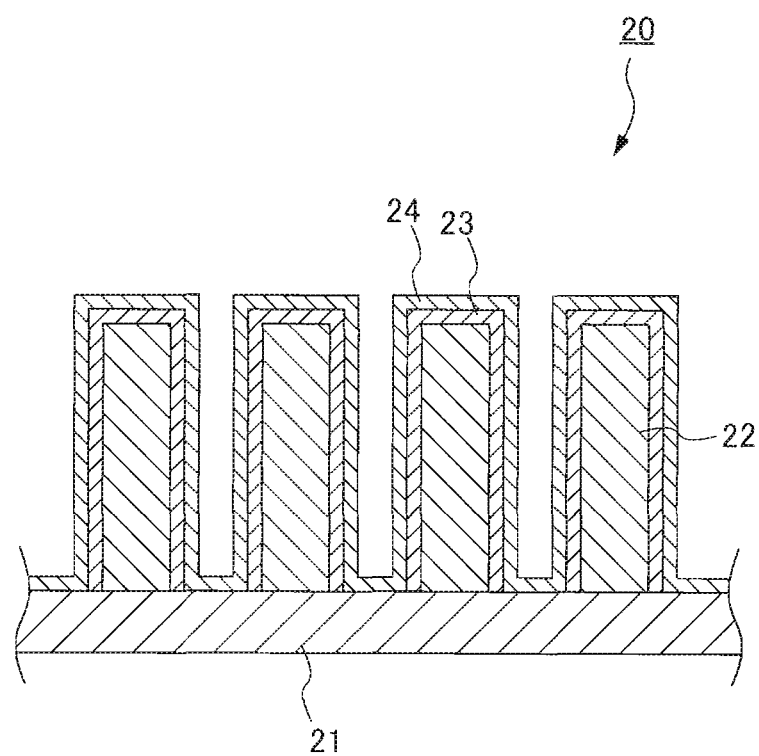
FIG. 2 shows a schematic view illustrating a negative electrode base member of Example 2 according to the present invention.

A schematic drawing of negative electrode base member 20 according to this embodiment is shown in FIG. 2. As shown in FIG. 2, the negative electrode base member 20 according to this embodiment is composed of support 21, organic film 22 covered with metal oxide film 23 on the surface layer, and metal film 24. More specifically, this embodiment is characterized by metal film 24 formed by a plating process on support 21 having organic film 22 covered with metal oxide film 23 on the surface layer.

Support

The support 21 used in the negative electrode base member 20 according to this embodiment may be similar to that of the first embodiment.

Organic Film

The organic film 22 of the negative electrode base member 20 according to this embodiment may be formed from an organic compound or an organic resin, and is not particularly limited. Preferably, the organic film 22 may be formed from an organic compound having a hydrophilic group or an organic resin having a hydrophilic group. When there exists a hydrophilic group on the surface of the organic film 22, this hydrophilic group interacts with the metal oxide film-forming material described later, and consequently, a metal oxide film 23 rigidly adhering to the organic film 22 can be formed.

The aforementioned organic film 22 is preferably one formed from the photoresist composition described later, and is more preferably a photoresist pattern produced by patterning to give a predetermined shape by pattern exposure. In producing the metal oxide film 23 on a photoresist pattern, when there exists a hydrophilic group on the surface of the photoresist pattern, metal oxide film 23 rigidly adhering to the photoresist pattern can be produced as a result of interaction of this hydrophilic group with the metal oxide film-forming material described later. Accordingly, a pattern having a high density and high mechanical strength can be produced.

Photoresist Composition, and Photoresist Pattern

The photoresist composition and the photoresist pattern for use in forming the negative electrode base member 20 according to this embodiment may be similar to those for the first embodiment.

Metal Oxide Film

The metal oxide film 23 that covers the surface layer of the organic film 22, which is not particularly limited, may be any one as long as it is formed from a metal oxide. A silica coating is preferred. The metal oxide film 23 is formed from the metal oxide film-forming material described below.

Metal Oxide Film-Forming Material

The metal oxide film-forming material of this embodiment is characterized by containing a metal compound which can yield a hydroxy group by hydrolysis, and a solvent that dissolves this metal compound, and does not have a functional group being reactive with this metal compound.

Metal Compound

The metal compound is, as described above, a compound which can yield a hydroxy group by hydrolysis. When the metal oxide film-forming material containing this metal compound is coated on the organic film 22, or thereafter water (preferably deionized water) is further coated thereon as needed, the metal compound reacts with moisture in the ambient air or the coated water even at a low temperature of around room temperatures, whereby a hydroxy group is yielded by hydrolysis. Subsequently, dehydrating concentration of thus yielded hydroxy groups results in bonding of a plurality of metal compound molecules to one another, thereby forming a compact metal oxide film 23 having a high film density. Furthermore, when the aforementioned organic film 22 has a reactive group such as a carboxy group or a hydroxy group, the reactive group of the organic film 22 reacts with the hydroxy group yielded from the metal compound (dehydrating concentration, adsorption and the like), whereby the metal oxide film 23 rigidly adhering to the surface of the organic film 22 is formed.

As the metal compound, for example, a metal compound having a functional group which can yield a hydroxy group by hydrolysis may be used, and therein, the metal atom preferably bonds to the functional group directly. The number of the functional groups is preferably no less than 2, more preferably 2 to 4, and still more preferably 4 per metal atom. When the metal compound has no less than 2 functional groups per metal atom, dehydrating concentration of the hydroxy groups yielded by hydrolysis occurs, and thus a plurality of metal compound molecules bond sequentially to form a rigid metal oxide film 23.

The functional group which can yield a hydroxy group by hydrolysis is exemplified by an alkoxy group, isocyanate group, carbonyl group, and the like. In addition, halogen groups are also included in the functional groups described above according to this embodiment since halogen atoms have a similar function. The alkoxy group is exemplified by linear or branched lower alkoxy groups having 1 to 5 carbon atoms, and specific examples include a methoxy group (—O-Me), ethoxy group (—O-Et), n-propoxy group (—O-nPr), isopropoxy group (—O-iPr), n-butoxy group (—O-nBu), and the like. The halogen atom is exemplified by a chlorine atom, fluorine atom, bromine atom, iodine atom and the like, and a chlorine atom is particularly preferably used.

When a reactive group such as a carboxy group or hydroxy group is present on the surface of the organic film 22, an alkoxy group or isocyanate group is preferably used since a condensation reaction with the reactive group is allowed, thereby capable of forming the metal oxide film 23 rigidly adhering to the organic film 22. In addition, a carbonyl group or halogen atom is preferably used since it can be adsorbed by interaction with the reactive group such as a carboxy group or hydroxy group present on the surface of the organic film 22, thereby being capable of forming the metal oxide film 23 rigidly adhering to the organic film 22. In particular, the isocyanate group and halogen atoms (particularly, a chlorine atom) are preferred due to high activity, and abilities to form the metal oxide film 23 simply without particularly carrying out the heat treatment. Moreover, the isocyanate group is most preferably used.

Exemplary metals that constitute the metal compound, in addition to common metals in general, may also include boron, silicon, germanium, antimony, selenium, tellurium and the like. The metal that constitutes the metal compound is exemplified by titanium, zirconium, aluminum, niobium, silicon, boron, lanthanide, yttrium, barium, cobalt, iron, zirconium, tantalum, and the like. Of these, titanium and silicon are preferred, and silicon is particularly preferred. Additionally, the number of metal atoms in the metal compound may be 1, or 2 or more, and is preferably 1.

The metal compound may have an atom or an organic group other than the functional group which can yield a hydroxy group by hydrolysis. For example, a hydrogen atom may be included. The organic group is exemplified by alkyl groups (preferably lower alkyl groups having 1 to 5 carbon atoms) and the like, and an ethyl group and a methyl group are preferred.

The metal compounds having an alkoxy group (hereinafter, also referred to as "metal alkoxides") are exemplified by: metal alkoxide compounds other than those of rare earth metals such as titanium butoxide ($Ti(O-nBu)_4$), zirconium propoxide ($Zr(O-nPr)_4$), aluminum butoxide ($Al(O-nBu)_3$), niobium butoxide ($Nb(O-nBu)_5$), silicon tetramethoxide ($Si(O-Me)_4$) and boron ethoxide ($B(O-Et)_3$); metal alkoxide compounds of a rare earth metal such as lanthanide isopropoxide ($Ln(O-iPr)_3$) and yttrium isopropoxide ($Y(O-iPr)_3$); double alkoxide compounds such as barium titanium alkoxide ($BaTi(OR^{60})_x$) (wherein, "$R^{60}$" represents a lower alkyl group having 1 to 5 carbon atoms, and X is an integer of 2 to 4); metal alkoxide compounds having two or more alkoxy groups and having an organic group other than alkoxy groups such as methyltrimethoxysilane ($MESi(O-Me)_3$) and diethyldiethoxysilane ($Et_2Si(O-Et)_2$); metal alkoxide compounds having a ligand such as acetyl acetone, and having two or more alkoxy groups, and the like.

Furthermore, fine particles of an alkoxide sol or alkoxide gel obtained by adding a small amount of water to the metal alkoxides, followed by partial hydrolysis and condensation can be also used. Additionally, dinuclear or cluster type alkoxide compounds having multiple number or multiple kinds of metal elements such as titanium butoxide tetramer ($C_4H_9O[Ti(OC_4H_9)_2O]_4C_4H_9$), as well as polymers on the basis of a metal alkoxide compound primarily crosslinked via an oxygen atom, and the like are also included in the metal alkoxides.

The metal compound having an isocyanate group is exemplified by compounds having two or more isocyanate groups represented by the general formula $[M(NCO)_x]$ (wherein, M is a metal atom, and X is an integer of 2 to 4). Specific examples include silane tetraisocyanate ($Si(NCO)_4$), titanium tetraisocyanate ($Ti(NCO)_4$), zirconium tetraisocyanate ($Zr(NCO)_4$), aluminum triisocyanate ($Al(NCO)_3$), and the like.

The metal compound having a halogen atom is exemplified by halogenated metal compounds having two or more (preferably 2 to 4) halogen atoms represented by the general formula: $[M(X_1)_n]$ (wherein, M represents a metal atom; $X_1$ represents one selected from a fluorine atom, chlorine atom, bromine atom, and iodine atom; and n is an integer of 2 to 4). Specific examples include tetrachlorotitanium ($TiCl_4$), tetrachlorosilane ($SiCl_4$), and the like. Furthermore, the metal compound having a halogen atom may be a metal complex, and cobalt chloride ($CoCl_2$) or the like may be used.

The metal compound having a carbonyl group is exemplified by metal carbonyl compounds such as titanium oxoacetyl acetate ($TiO(CH_3COCH_2COO)_2$) and iron pentacarbonyl ($Fe(CO)_5$), and polynuclear clusters thereof.

Among a variety of metal compounds described above, silicon compounds having two or more (preferably 2 to 4) isocyanate groups and/or halogen atoms may be particularly preferably used in light of high activity, and capability of forming the metal oxide film 13 in a simple manner without carrying out the heat treatment. The number of silicon in one molecule of the silicon compound may be one, or two or more, but is preferably 1. Particularly, compounds represented by the general formula: [SiWa] (wherein, "a" represents an integer of 2 to 4; W represents an isocyanate group or a halogen atom; and W present in a plurality number may be the same or different with each other) are preferred. The aforementioned "a" is more preferably 4, and the halogen atom is more preferably a chlorine atom similarly to the aforementioned compounds. Of these, the silicon compounds having an isocyanate group are particularly preferred.

The metal compounds described in the foregoing may be used alone, or two or more thereof may be used in combination as a mixture.

Solvent

The metal oxide film-forming material of this embodiment is prepared by dissolving the aforementioned metal compound in a solvent (S). The solvent (S) is acceptable as long as it is a solvent (S1) that does not have a functional group that is reactive with the metal compound and can dissolve the metal compound, thus a conventionally well-known organic solvent may be used. The functional group that is reactive with the metal compound is exemplified by a hydroxy group, a carboxy group, a halogen group, and groups having a carbon-carbon double bond such as a vinyl group, and the like. Thus, the metal compounds can be stably present when the solvent does not have these functional groups.

Specifically, the aforementioned solvent (S1) is preferably an aliphatic compound. The term "aliphatic" referred to herein falls in a relative concept contrary to "aromatic", and is defined to mean groups, compounds etc., not having aromatic characteristics. In other words, the "aliphatic compound" means a compound not having aromatic characteristics. The aliphatic compound may be either a chain compound not having a ring in its structure, or a cyclic compound having a ring in its structure. However, the aliphatic compound herein is preferably a cyclic compound. The cyclic compound is preferably a hydrocarbon compound, and more preferably a saturated hydrocarbon compound. Examples of such cyclic compounds include monocycloalkanes and polycycloalkanes such as bicycloalkanes, tricycloalkanes and tetracycloalkanes, as well as compounds having a substituent such as an alkyl group bonded to the ring of these alkanes, and the like.

In addition, it is preferred that a solvent having less impact on the environment be selected as the aforementioned solvent (S1). For example, a solvent produced from a naturally occurring substance for a starting material is preferably used. The solvent produced from a naturally occurring substance for a starting material is exemplified by terpene-based solvents and the like, obtained from plant essential oil components (e.g., monocyclic monoterpene such as p-menthane, o-menthane and m-menthane, and bicyclic monoterpene such as pinane etc., as described later).

Additionally, it is preferable to select and use as the solvent (S1) a solvent which does not dissolve the organic film 22. Such a solvent is less likely to impair the shape of the photoresist pattern when, in particular, the metal oxide film 23 is formed on the surface of the photoresist pattern.

Particularly, the compound represented by the following general formula (I) is preferably used as the solvent (S1) in terms of no reactivity with metal compounds, less influences on the environment, and no dissolving property of the photoresist pattern, and the like.

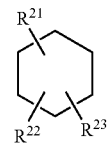

(1)

[In the formula (I), $R^{21}$ to $R^{23}$ each independently represent a hydrogen atom, or a linear or branched alkyl group; at least two of $R^{21}$ to $R^{23}$ are alkyl groups, and the alkyl groups may form a ring via bonding to a carbon atom other than the neighboring carbon atom of the alkyl group in the cyclohexane ring.]

In the formula (I), at least two of $R^{21}$ to $R^{23}$ are a linear or branched alkyl groups. In other words, two of $R^{21}$ to $R^{23}$ may be a linear or branched alkyl group, while the other one may be a hydrogen atom; alternatively, all of $R^{21}$ to $R^{23}$ may be a linear or branched alkyl group. It is preferred that at least two of $R^{21}$ to $R^{23}$ be a linear or branched alkyl group.

As the linear or branched alkyl group of $R^{21}$ to $R^{23}$, lower alkyl groups having 1 to 5 carbon atoms are preferred, and lower alkyl groups having 1 to 3 carbon atoms are more preferred. Specific examples include a methyl group, ethyl group, propyl group, isopropyl group, n-butyl group, isobutyl group, pentyl group, isopentyl group, neopentyl group, and the like. Among these, a methyl group or an isopropyl group is particularly preferred.

At least two alkyl groups among $R^{21}$ to $R^{23}$ may be the same or different from each other. At least one of $R^{21}$ to $R^{23}$ is preferably a branched alkyl group, and it is more preferred that at least one be an isopropyl group. It is preferred that the aforementioned solvent (S1), in particular, has both an isopropyl group and a methyl group.

The alkyl group of $R^{21}$ to $R^{23}$ may form a ring via bonding to a carbon atom in the cyclohexane ring that is not a carbon atom to which the alkyl group is initially bound. Herein, the phrase "form a ring via bonding to a carbon atom in the cyclohexane ring that is not a carbon atom to which the alkyl group is initially bound" means that a crosslinkage is formed between a carbon atom of the alkyl group that was not initially bound to a carbon atom of the cyclohexane ring, and a carbon atom of the cyclohexane ring that was not initially bound to a carbon atom of the alkyl group, via a group derived by eliminating one hydrogen atom from the alkyl group (i.e., alkylene group).

Positions to which $R^{21}$ to $R^{23}$ bond are not particularly limited, but it is preferred that at least two alkyl groups bond to positions 1 and 4 (para position), or positions 1 and 3 (meta position) of the cyclohexane ring, respectively.

Specific examples of the compound represented by the above formula (1) include p-menthane (boiling point: about 170° C.), m-menthane (boiling point: about 170° C.), o-menthane (boiling point: about 170° C.), pinane (boiling point: about 169° C.), and the like. Their structures are shown below. Among these, p-menthane is particularly preferred.

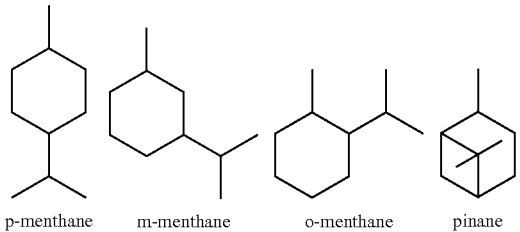

p-menthane   m-menthane   o-menthane   pinane

The solvent (S1) as described above may be used alone, or two or more thereof may be used in combination as a mixture. In the solvent (S), percentage of the solvent (S1) falls within the range of preferably 50 to 100% by mass, more preferably 80 to 100% by mass, and still more preferably 100% by mass.

The solvent (S) may contain solvent (S2) other than the solvent (S1) in a range not to impair the effects of the present invention. Examples of the solvent (S2) include methanol, ethanol, propanol, n-hexane, n-heptane, toluene, benzene, cumene, and the like. Of these, in light of formability of compact films, n-heptane (boiling point: about 98° C.) and cumene (boiling point: about 152° C.) are preferred. The solvent (S2) may be used alone, or two or more thereof may be used in combination as a mixture.

The content of the solvent (S), which is not particularly limited, is preferably within the range so as to give a molar concentration in the composition for forming a metal oxide film (total concentration of the metal compound, and the organic compound used if necessary as described later) being approximately 1 to 200 mM, preferably 50 to 150 mM, and more preferably 50 to 100 mM. The molar concentration falling within this range is preferred since more uniform metal oxide film can be formed.

Optional Component

The metal oxide film-forming material may contain an optional component in addition to the metal compound and the solvent (S). Examples of the optional component include organic compounds. According to the metal oxide film-forming material containing an organic compound, a composite film of the metal oxide and the organic compound can be formed. The organic compound is not particularly limited as long as it can be dissolved in the solvent (S). The term to "dissolve" referred to herein is not limited to dissolution of the organic compound alone, but may include dissolution in a solvent such as chloroform, after forming a complex with metal alkoxides as in the case of 4-phenylazobenzoic acid. The molecular weight of the organic compound is not particularly limited.

In light of the film strength, and additional enhancement of adhesiveness to the organic film 22, it is preferred that the organic compound has a plurality of reactive groups (preferably hydroxy groups or carboxy groups), and takes a solid form at a room temperature (25° C.). Examples of such organic compounds which may be preferably used include: polymer compounds having hydroxy groups or carboxy groups such as polyacrylic acid, polyvinyl alcohol, polyvinyl phenol, polymethacrylic acid and polyglutamic acid; polysaccharides such as starch, glycogen and colominic acid; disaccharides and monosaccharides such as glucose and mannose; porphyrin compounds and dendrimers having a terminal hydroxy group or a terminal carboxy group, and the like.

Moreover, cationic polymer compounds may be preferably used for the organic compound. Since the metal alkoxides and metal oxides may anionically interact with a cation of cationic polymer compounds, formation of a rigid bond can be achieved. Specific examples of the cationic polymer compound include PDDA (polydimethyldiallylammonium chloride), polyethyleneimine, polylysine, chitosan, dendrimers having a terminal amino group, and the like.

These organic compounds have a function as structural components for forming a thin film having prominent mechanical strength. Additionally, the organic compound can serve as a functional moiety for imparting a function to the resulting thin film, or as a component for forming in the thin film a hole corresponding to its molecular shape by removing the organic compound after film formation. The organic compounds may be used alone, or two or more thereof may be used in combination as a mixture. The content of the organic compound is preferably 0.1 to 50 parts by mass with respect to 100 parts by mass of the metal compound, and particularly preferably 1 to 20 parts by mass.

Formation of Metal Oxide Film

Using the metal oxide film-forming material described above, metal oxide film 23 is formed on the organic film 22. Specifically, after the metal oxide film-forming material is coated on the surface of the organic film 22, the surface is washed with an organic solvent and then dried. In other words, after coating the metal oxide film-forming material, excess metal compounds (for example, metal compounds adhering to the support 21) are removed by washing. Then, before the following drying is completed, the metal compound is gradually hydrolyzed by moisture in the air to yield hydroxy groups, and the hydroxy groups undergo dehydrating concentration, whereby the metal oxide film 23 is formed on the surface of the organic film 22. When the metal oxide film-forming material contains an organic material, the metal oxide film 23 constituted with a composite thin film of the organic material and the metal oxide is formed.

With respect to such processes, conventional silica coating requires a high-temperature treatment as in SOG (spin-on-glass) process and the like; therefore, thermal sagging of the photoresist pattern may result due to the high-temperature treatment when a photoresist pattern is applied as, for example, the organic film 22 as described above. To the contrary, since the metal oxide film 23 can be formed at low temperatures with the metal oxide film-forming material of this embodiment, deterioration of the shape of the covered photoresist pattern can be avoided. The operation for forming the metal oxide film 23 is preferably performed under an inert gas atmosphere in light of controllability of the reactivity. In this instance, the process is executed without utilizing moisture in the air.

Conventionally well-known methods can be employed as the method for coating the metal oxide film-forming material, without particular limitation. For example, a method in which the support 21 having the organic film 22 is immersed in a metal oxide film material (dip coating method), and a method in which the metal oxide film-forming material is coated on the organic film 22 by a spin coating method may be exemplified. Alternatively, methods such as a layer-by-layer sequential adsorption method and the like can also form the metal oxide film 23.

Since the temperature at which the metal oxide film-forming material is coated on the organic film 22 (coating temperature) varies depending on the activity of the metal compound used, it cannot be categorically limited, but in general, may fall within the range of 0 to 100° C. Also, a time period starting from a time point of coating the metal oxide film-forming material on the organic film 22 until the drying completion time point (including time for coating, washing, and adsorption that is conducted as needed), i.e., contact time of the metal oxide film-forming material before hydrolysis with the organic film 12, and the temperature during this period (contact temperature) may vary depending on the activity of the metal compound employed, and cannot be categorically limited. However, the contact time may be generally from several seconds to several hours, while the contact temperature may fall within a similar range to that of the coating temperature described above.

The organic solvent preferably used in washing may be similar solvents to those exemplified as the solvent (S) of the metal oxide film-forming material. The washing can be carried out by preferably employing, for example: a method in which an organic solvent is supplied by a spraying method etc., on the surface of the coating constituted with the metal oxide film-forming material, and thereafter the excess organic solvent is aspirated under a reduced pressure; a method of immersion and washing in the organic solvent; a method of spraying and washing; a method of washing with steam, and the like. The temperature conditions of washing may be similar to those when coating the metal oxide film-forming material is carried out.

After the metal oxide film-forming material is coated on the surface of the organic film 22, the excess metal compounds on the support 21 is removed by washing, whereby the metal oxide film 23 having superior uniformity of the film thickness can be formed. More specifically, only the metal compounds which had been adsorbed predominantly by weak physical adsorption are removed by washing, while only the metal compounds which had been chemically adsorbed remain on the surface of the organic film 22 uniformly. Accordingly, a uniform thin film of a nanometer level can be formed with an extremely high level of accuracy, and favorable reproducibility. Therefore, the aforementioned washing operation is particularly efficacious when chemical adsorption occurs between the organic film 22 and the metal compound.

The term "chemical adsorption" herein referred to means a state in which a chemical bond (covalent bond, hydrogen bond, coordinate bond, etc.) or an electrostatic bond (ionic bond, etc.) is formed between the metal compounds and the reactive groups (preferably, hydroxy group or carboxy group) existing on the surface of the organic film 22, and thus the metal compounds and/or metal ions thereof are bonded thereto. Further, the term "physical adsorption" means a state in which the metal compounds and/or metal ions thereof are bonded to the surface of the organic film 22 by a weak intermolecular force such as van der Waals force.

The drying method carried out after washing, not limited specifically, may be conventionally well-known methods. For example, a gas for drying such as nitrogen gas may be used, or drying by swinging off may be carried out as is when the metal oxide film-forming material was coated using a spin coater.

During a term after coating the metal oxide film-forming material and before drying, the workpiece may be left to stand in order to allow the chemical adsorption and/or physical adsorption of the metal compounds in the coating constituted with the metal oxide film-forming material to proceed towards the organic film 22 as needed.

During a term after washing the coating constituted with the metal oxide film-forming material and before drying, a hydrolytic treatment for yielding hydroxy groups may be carried out in which water is brought into contact with the coating to permit hydrolysis of the metal compounds on the surface. Accordingly, the metal oxide film 23 having a plurality of laminated coatings can be readily formed, and the thickness of the metal oxide film 23 can be easily adjusted. Therefore, the hydroxy groups yielded on the coating surface constituted with the metal oxide film-forming material react with the metal compounds in the coating formed by further coating the metal oxide film-forming material thereon to result in rigid cohesion, whereby the metal oxide film 23 having a plurality of laminated coatings can be obtained. The procedure employed for hydrolytic treatment may be conventionally well-known methods, without particular limitation. For example, the most common method is a sol-gel method in which the coating is brought into contact with water. More specifically, a method of coating water on the coating surface, and a method of immersing in an organic solvent that contains a small amount of water may be exemplified. When the included metal compound is highly reactive with water, the hydrolytic treatment may not be carried out since hydrolysis occurs by leaving to stand in the ambient air due to the reaction with water vapor in the ambient air. The water which may be used is preferably deionized water for the purpose of producing metal oxides with high purity while preventing contamination with impurities and the like. Additionally, the treatment time period can be significantly shortened by using a catalyst such as an acid or base in the hydrolytic treatment.

The film thickness of the metal oxide film 23 is not particularly limited. The film thickness is preferably no less than 0.1 nm, more preferably 0.5 to 50 nm, and still more preferably 1 to 30 nm. The film thickness of the metal oxide film 23 can be adjusted by carrying out the coating, washing, and hydrolytic treatment repeatedly of the metal oxide film-forming material. More specifically, by repeating a series of operations of: coating the metal oxide film-forming material to form a coating; thereafter washing followed by leaving to stand as needed; and subjecting to a hydrolysis treatment, the metal oxide film 23 composed of a uniform thin film having a desired thickness can be formed. For example, the metal oxide film 23 having a film thickness of several nm to several ten nm, or several hundred nm in some conditions can be formed with a high level of accuracy.

When the metal oxide film-forming material that includes a metal alkoxide containing one kind of metal atom such as silicon tetraisocyanate or titanium butoxide is used as the metal compound, a thin film having a thickness of several angstroms can be laminated serially by controlling with contact Conditions. In this instance, increase in the film thickness per cycle corresponds to the number of lamination times of the metal oxide film-forming material. On the other hand, when fine particles of an alkoxide gel is used as the metal compound, thin films having a thickness of approximately 60 nm can be also laminated in one cycle. In addition, when a coating constituted with the metal oxide film-forming material is formed by a spin coating method, the film thickness can be appropriately controlled to approximately several nm to 200 nm by changing the solvent used, and the concentration of the metal compound, spin rate, and the like. In such a procedure, metal oxide film 13 having laminated thin films constituted with different kinds of metal oxides can be also obtained by changing the type of metal compounds used every cycle.

Although the total film thickness of the organic film 22 and the metal oxide film 23 is not particularly limited, it is preferably no greater than 1 μm, more preferably no greater than 0.7 μm, and more preferably no greater than 0.5 μm. Although the lower limit of the total thickness is not particularly limited, it is preferably no less than 0.01 µm, and more preferably no less than 0.05 µm.

The plating process and the lithium ion secondary cell of the negative electrode base member according to this embodiment are similar to the plating process and the lithium ion secondary cell of the first embodiment.

Third Embodiment

Negative Electrode Base Member

Figure 3:
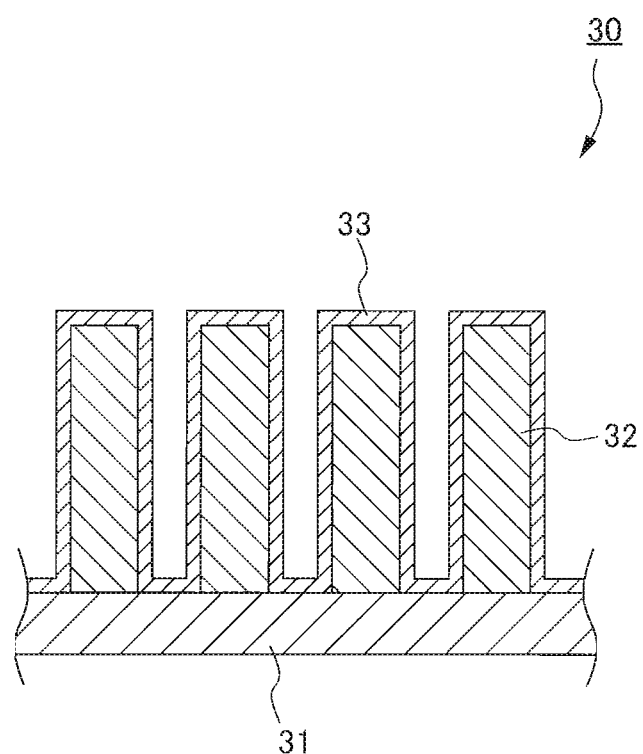
FIG. 3 shows a schematic view illustrating a negative electrode base member of Example 3 according to the present invention.

A schematic drawing of negative electrode base member 30 according to this embodiment is shown in FIG. 3. As shown in FIG. 3, the negative electrode base member 30 according to this embodiment is composed of support 31, composite film 32, and metal film 33. More specifically, this embodiment is characterized by metal film 33 formed on support 30 having composite film 32.

Support

The support 31 used in the negative electrode base member 30 according to this embodiment may be similar to that of the first embodiment.

Composite Film

The composite film 32 in the negative electrode base member 30 according to this embodiment is formed from a composite film-forming material including an organic component such as an organic compound or an organic resin, and an inorganic component such as an inorganic compound or an inorganic resin. Such a composite film-forming material, which is not particularly limited, is preferably a composite film formed from the composite film-forming material described below, and is more preferably a patterned composite film produced by patterning to give a predetermined shape by pattern exposure.

Composite Film-Forming Material

The composite film-forming material for use in forming the negative electrode base member 30 according to this embodiment is not particularly limited as long as it contains an organic component such as an organic compound or an organic resin, and an inorganic component such as an inorganic compound or an inorganic resin.

The inorganic component, which is not particularly limited, is acceptable as long as it has satisfactory transparency required for the exposure light employed in conducting patterning exposure, and may be, for example, glass, ceramics (cordierite, etc.), metals, and the like. More specific examples include glass powders of $PbO-SiO_2$-based, $PbO-B_2O_3-SiO_2$-based, $ZnO-SiO_2$-based, $ZnO-B_2O_3-SiO_2$-based, $Bio-SiO_2$-based, $BiO-B_2O_3-SiO_2$-based lead borosilicate glass, zinc borosilicate glass, bismuth borosilicate glass and the like; cobalt oxide, iron oxide, chromium oxide, nickel oxide, copper oxide, manganese oxide, neodymium oxide, vanadium oxide, cerium oxide TIPEQUE yellow, cadmium oxide, ruthenium oxide and silica, each oxide of Na, K, Mg, Ca, Ba, Ti, Zr, Al or the like such as magnesia and spinel; fluorescent substance powders such as ZnO:Zn, $Zn_3(PO_4)_2$:Mn, $Y_2SiO_5$:Ce, $CaWO_4$:Pb, $BaMgAl_{14}O_{23}$:Eu, ZnS:(Ag, Cd), $Y_2O_3$:Eu, $Y_2SiO_5$:Eu, $Y_3Al_5O_{12}$:Eu, $YBO_3$:Eu, (Y, Gd)$BO_3$:Eu, $GdBO_3$:Eu, $ScBO_3$:Eu, $LuBO_3$:Eu, $Zn_2SiO_4$:Mn, $BaAl_{12}O_{19}$:Mn, $SrAl_{13}O_{19}$:Mn, $CaAl_{12}O_{19}$:Mn, $YBO_3$:Tb, $BaMgAl_{14}O_{23}$:Mn, $LuBO_3$:Tb, GdBO:Tb, $ScBO_3$:Tb, $Sr_5Si_3O_3Cl_4$:Eu, ZnS:(Cu, Al), ZnS:Ag, $Y_2O_2S$:Eu, ZnS:Zn, (Y, Cd)$BO_3$:Eu, and $BaMgAl_{12}O_{23}$:Eu; metal powders of iron, nickel, palladium, tungsten, copper, aluminum, silver, gold, or platinum, and the like. Glass, Ceramics and the like are preferred due to being superior in transparency. In particular, glass powders (glass frit) are particularly preferred since the most prominent effects can be exhibited when they are used.

The particle size of such inorganic components may vary depending on the pattern configuration of the composite film subjected to patterning, but preferably the component used may have a mean particle diameter of 0.5 to 10 µm, and more preferably 1 to 8 µm. By thus setting the mean particle diameter in the above range, the surface unevenness does not occur in pattern formation with a high level of accuracy, and diffusion of exposure light in patterning, which may lead to failure in reaching the bottom, can be avoided. The shape of such an inorganic component may be spherical, block, flaky, dendrite, or the like. These may be used alone, or in combination of two or more thereof.

Furthermore, the inorganic component may be a mixture of fine particles having different physical properties. In particular, by using ceramics powder or glass powders having different softening points, the constraction rate in baking can be suppressed. In addition, for the purpose of preventing secondary aggregation, and improving the dispersibility, in view of the inorganic component having a mean particle diameter of 0.5 to 10 µm, it may be subjected to a surface treatment with an organic acid, inorganic acid, silane coupling agent, titanate-based coupling agent, aluminum-based coupling agent or the like beforehand in the range not to impair the properties as an inorganic component. The surface treatment preferably includes: dissolving a treatment agent in an organic solvent, water or the like; then stirring the mixture after adding the inorganic component; distilling off the solvent; and heating at about 50° C. to 200° C. for 2 hrs to execute the heat treatment. Moreover, the treatment agent may be added also in pasting the composite film-forming material.

The organic component preferably contains (A3) a water soluble cellulose derivative, (B3) a photopolymerizable monomer and (C3) a photopolymerization initiator, and more preferably further contains (D3) an acrylic resin having a hydroxy group.

(A3) Water Soluble Cellulose Derivative

The water soluble cellulose derivative (A3) is not particularly limited, and specific examples include carboxymethylcellulose, hydroxyethylcellulose, hydroxyethylmethylcellulose, hydroxypropylcellulose, ethylhydroxyethylcellulose, carboxymethylethylcellulose, hydroxypropylmethylcellulose, and the like. These may be used alone, or two or more thereof may be used in combination. The composite film-forming material containing such a water soluble cellulose derivative as a binder resin has a superior development resistance since the transmittance of an actinic ray or radiation such as a ultraviolet ray, excimer laser, X-ray, electronic beam or the like; therefore, a patterned composite film can be formed with a high level of accuracy.

(B3) Photopolymerizable Monomer

The photopolymerizable monomer (B3) is not particularly limited, and specific examples include ethylene glycol diacrylate, ethylene glycol dimethacrylate, triethylene glycol diacrylate, triethylene glycol dimethacrylate, trimethylolpropane triacrylate, trimethylolpropane trimethacrylate, trimethylolethane triacrylate, trimethylolethane trimethacrylate, pentaerythritol diacrylate, pentaerythritol dimethacrylate, pentaerythritol triacrylate, pentaerythritol trimethacrylate, pentaerythritol tetraacrylate, pentaerythritol tetramethacrylate, dipentaerythritol tetraacrylate, dipentaerythritol tetramethacrylate, dipentaerythritol pentaacrylate, dipentaerythritol pentamethacrylate, dipentaerythritol hexaacrylate, dipentaerythritol hexamethacrylate, glycerol acrylate, glycerol methacrylate and cardoepoxy diacrylate, as well as fumarate esters prepared by substituting (meth)acrylate with fumarate, itaconate esters prepared by substituting (meth)acrylate with itaconic acid, maleate esters prepared by substituting (meth)acrylate with maleic acid in the exemplary compounds, and the like.

(C3) Photopolymerization Initiator

The photopolymerization initiator (C3) is not particularly limited, and illustrative examples include benzophenones, benzoins, benzoinalkyl ethers, acetophenones, aminoacetophenones, benzyls, benzoinalkyl ethers, benzylalkyl ketals, anthraquinones, ketals, thioxanthones, and the like. More specific examples include 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine, 2,4,6-trimethylbenzoyldiphenylphosphineoxide, 1-[4-(2-hydroxyethoxy)phenyl]-2-hydroxy-2-methyl-1-propane-1-one, 2,4-diethylthioxanthone, 2,4-dimethylthioxanthone, 2-chlorothioxanthone, 1-chloro-4-propoxythioxanthone, 3,3-dimethyl-4-methoxybenzophenone, benzophenone, 1-(4-isopropylphenyl)-2-hydroxy-2-methylpropane-1-one, 1-(4-dodecylphenyl)-2-hydroxy-2-methylpropane-1-one, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxyacetophenone, benzyldimethyl ketal, benzyl-β-methoxyethylacetal, 1-phenyl-1,2-propanedione-2-(o-ethoxycarbonyl)oxime, methyl o-benzoylbenzoate, bis(4-dimethylaminophenyl)ketone, 4,4'-bisdiethylaminobenzophenone, benzyl, benzoin, benzoin methyl ether, benzoin ethyl ether, benzoin isopropyl ether, benzoin n-butyl ether, benzoin isobutyl ether, p-dimethylaminoacetophenone, p-tert-butyltrichloroacetophenone, p-tert-butyldichloroacetophenone, thioxanthone, 2-methylthioxanthone, 2-isopropylthioxanthone, dibenzosuberone, α,α-dichloro-4-phenoxyacetophenone, pentyl-4-dimethylaminobenzoate, 2-(o-chlorophenyl)-4,5-diphenylimidazolyl dimer, and the like. These may be used alone, or two or more thereof may be used in combination.

The content of the photopolymerization initiator (C3) is preferably 0.1 to 10 parts by mass, and more preferably 0.2 to 5 parts by mass with respect to 100 parts by mass of total mass of the water soluble cellulose derivative (A3) and the photopolymerizable monomer (B3). The content of the photopolymerization initiator falling within the above range enables occurrence of insufficient hardening of the bottom part which may result from absorption of the photopolymerization initiator to be inhibited without deteriorating the curability.

(D3) Acrylic Resin Having Hydroxy Group (D3) An acrylic resin having a hydroxy group may be blended in the organic component as needed. Such an acrylic resin having a hydroxy group is exemplified by a copolymer obtained by polymerization of a monomer having a hydroxy group as a principal copolymerizable monomer, and further other monomer copolymerizable therewith as needed.

The monomer having a hydroxy group is suitably a monoesterified product of acrylic acid or methacrylic acid, and a monoalcohol having 1 to 20 carbon atoms. Specific examples include hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, and the like. In addition, monoesterified products of acrylic acid or methacrylic acid with glycol having 1 to 10 carbon atoms as well as epoxy ester compounds such as glycerol acrylate, glycerol methacrylate, dipentaerythritol monoacrylate, dipentaerythritol monomethacrylate, ε-caprolactone denatured hydroxylethyl acrylate, ε-caprolactone denatured hydroxylethyl methacrylate, and 2-hydroxy-3-phenoxypropyl acrylate may be included.

The monomer that copolymerizes with the monomer having a hydroxy group described above is exemplified by α,β-unsaturated carboxylic acids such as acrylic acid, methacrylic acid, itaconic acid, citraconic acid, itaconic acid, maleic acid and fumaric acid, and anhydrides or half esterified products thereof, α,β-unsaturated carboxylate esters such as methyl acrylate, ethyl acrylate, n-propyl acrylate, isopropyl acrylate, n-butyl acrylate, isobutyl acrylate, sec-butyl acrylate, cyclohexyl acrylate, 2-ethylhexyl acrylate, stearyl acrylate, methyl methacrylate, ethyl methacrylate, n-propyl methacrylate, isopropyl methacrylate, sec-propyl methacrylate, n-butyl methacrylate, isobutyl methacrylate, sec-butyl methacrylate, cyclohexyl methacrylate, 2-ethylhexyl methacrylate, stearyl methacrylate, 2,2,2-trifluoromethyl acrylate and 2,2,2-trifluoromethyl methacrylate, styrenes such as styrene, α-methylstyrene, p-vinyltoluene, and the like. In addition, acrylonitrile, methacrylonitrile, acrylamide, methacrylamide, vinyl acetate, glycidyl acrylate, glycidyl methacrylate or the like may be used. These may be used alone, or two or more thereof may be used in combination.

The molecular weight of such an acrylic resin having a hydroxy group (D3) is preferably no greater than 20,000. The molecular weight is more preferably 15,000 to 5,000, and still more preferably 12,000 to 8,000. When the molecular weight exceeds 20,000, the acrylic resin having a hydroxy group (D3) is preferably no greater than 50 parts by mass with respect to 100 parts by mass of total mass of the water soluble cellulose derivative (A3) and the acrylic resin having a hydroxy group (D3).

Furthermore, the content of the acrylic resin having a hydroxy group (D3) is preferably 50 to 90 parts by mass, more preferably 60 to 80 parts by mass, and most preferably 65 to 75 parts by mass with respect to 100 parts by mass of the amount of entire resin components in the composite film-forming material. The amount of the blended component (D) falling within the above range is preferred since favorable performances in all terms of accuracy of pattern formation, development resistance, development performances, generation of development residues, and the like can be achieved.

Others

Moreover, in addition to the components (A3) to (D3), additives such as an ultraviolet ray absorbing agent, sensitizer, sensitizing aid, polymerization inhibitor, plasticizer, thickening agent, organic solvent, dispersant, deforming agent, and organic or inorganic precipitation inhibitor may be appropriately added to the organic component if necessary.

The sensitizer is added for improving the sensitivity. Specifically, 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)-benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)-isonaphthothiazole, 1,3-bis(4-dimethylaminobenzal)acetone, 1,3-carbonyl-bis(4-diethylaminobenzal)acetone, 3,3-carbonyl-bis(7-diethylaminocoumarin), N-phenyl-N- ethylethanolamine, N-phenylethanolamine, N-tolyldiethanolamine, N-phenylethanolamine, isoamyldimethylaminobenzoate, isoamyldiethylaminobenzoate, 3-phenyl-5-benzoylthiotetrazole, 1-phenyl-5-ethoxycarbonylthiotetrazole, and the like may be exemplified. These may be used alone, or two or more thereof may be used in combination.

The polymerization inhibitor is added for the purpose of improving thermal stability during storage. Specific examples include monoesterified products of hydroquinone or hydroquinone, N-nitrosodiphenylamine, phenothiazine, p-t-butylcatechol, N-phenylnaphthylamine, 2,6-di-t-butyl-p-methylphenol, chloranil, pyrogallol, and the like.

The plasticizer is added for the purpose of improving following capability to the substrate, and phthalate esters and the like may be used. More specifically, dibutyl phthalate (DBP), dioctyl phthalate (DOP), dicyclohexyl phthalate, polyethylene glycol, glycerin, dibutyl tartrate, and the like may be exemplified.

The deforming agent is added for the purpose of decreasing holes after baking by reducing formation of bubbles in the composite film-forming material or the composite film. Specific examples include alkylene glycol-based deforming agents such as polyethylene glycol (molecular weight: 400 to 800), silicone-based deforming agents, higher alcohol-based deforming agents and the like.

Such a composite film-forming material is prepared by dissolving or dispersing in a solvent. The solvent preferably has high affinity with inorganic components, and favorable solubility of the organic component. Furthermore the solvent is not particularly limited as long as it can impart suitable viscosity to composite film-forming materials, and can be readily evaporated to be removed by drying. Specific example include: ketones such as diethyl ketone, methylbutyl ketone, dipropylketone, and cyclohexanone; alcohols such as n-pentanol, 4-methyl-2-pentanol, cyclohexanol, and diacetone alcohol; ether-based alcohols such as ethylene glycol monomethyl ether, ethylene glycol monoethyl ether, ethylene glycol monobutyl ether, propylene glycol monomethyl ether, propylene glycol monoethyl ether, diethylene glycol monomethyl ether, diethylene glycol monoethyl ether, diethylene glycol dimethyl ether; and diethylene glycol diethyl ether; saturated aliphatic monocarboxylate alkyl esters such as n-butyl acetate, and amyl acetate; lactate esters such as ethyl lactate, and n-butyl lactate; ether-based esters such as methylcellosolve acetate, ethylcellosolve acetate, propylene glycol monomethyl ether acetate, propylene glycol monoethyl ether acetate, ethyl-3-ethoxypropionate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, and 4-propoxybutyl acetate, 2-methoxypentyl acetate, and the like. These may be used alone, or two or more thereof may be used in combination.

The content of the solvent is preferably no greater than 300 parts by mass with respect to 100 parts by mass of total mass of the organic component and the inorganic component for keeping the viscosity of the composite film-forming material in a suitable range. The content is more preferably 10 to 70 parts by mass, and still more preferably 25 to 35 parts by mass.

The percentages of the organic component and the inorganic powder in the composite film-forming material for use in forming the negative electrode base member 30 according to this embodiment are preferably 5 to 35 parts by mass of the organic component and 95 to 65 parts by mass of the inorganic component, with respect to 100 parts by mass of total mass of the composite film-forming material, respectively. The percentages are more preferably 10 to 30 parts by mass of the organic component and 90 to 70 parts by mass of the inorganic component, and still more preferably 15 to 25 parts by mass of the organic component and 85 to 75 parts by mass of the inorganic component.

Patterned Composite Film

The composite film-forming material is applied in a method which includes coating on the support 31, screen printing on the support 31, or the like. When pattern formation with a higher level of accuracy is desired, it is preferred that a dry film formed by coating and drying the composite film-forming material be transferred by pasting on the support 31. Upon coating, an applicator, a bar coater, wire bar coater, roll coater, curtain flow coater, or the like may be used. In particular, the roll coater is preferable because excellent film thickness uniformity is achieved and thick films can be formed efficiently.

As described above, an actinic ray or radiation such as a ultraviolet ray, excimer laser, X-ray or electronic beam is irradiated on the composite film formed by coating or transferring on the support 31 through a mask to effect image exposure. Next, a development process is carried out with an alkali developing solution or water to dissolve and remove unirradiated region, and baking the patterned composite film formed on the support 31 as needed. Alternatively, the entire face of the composite film is exposed without a mask, whereby a patterned composite film is formed without the development process, followed by baking if necessary. When formation of a pattern with a higher level of accuracy is intended, a dry film is transferred on the support 31, which is then subjected to image exposure, and thereafter a patterned composite film is formed by the development process. Alternatively, not image exposure but exposure of the entire face may be carried out to form a hardened coating without subjecting to a development process, followed by baking if necessary. The baking temperature may be any temperature which results in ablation of the organic component in the composite film-forming material, and for example, the baking conditions may be selected to attain the temperature of 400 to 600° C., and a time period of for 10 to 90 min. In other words, the "composite film" and the "patterned composite film" in this embodiment also include the films obtained after ablation of the organic component. When the dry film is transferred, thermo compression bonding with a hot roll laminator or the like may be preferably carried out. As a radiation irradiation device used in exposure, an ultraviolet ray irradiation device generally used in a photolithographic method, an exposure equipment used in manufacturing semiconductors and liquid crystal displays, or the like may be used.

The alkali component of the alkali developing solution used in the development process is exemplified by carbonate salts, bicarbonate salts, phosphate salts, pyrophosphate salts, hydroxides of an alkali metal such as lithium, sodium and potassium, primary amines such as benzylamine and butylamine, secondary amines such as dimethylamine, dibenzylamine and diethanolamine, tertiary amines such as trimethylamine, triethylamine and triethanolamine, cyclic amines such as morpholine, piperazine and pyridine, polyamines such as ethylenediamine and hexamethylenediamine, ammonium hydroxides such as tetramethylammonium hydroxide, tetraethylammonium hydroxide, trimethylbenzylammonium hydroxide and trimethylphenylbenzylammonium hydroxide, sulfonium hydroxides such as trimethylsulfonium hydroxides, trimethylsulfonium hydroxide, diethylmethylsulfonium hydroxide and dimethylbenzylsulfonium hydroxide, choline, silicate salt-containing buffers, and the like. Furthermore, in the development process, the type, composition and concentration of the developing solution, the development time, the development temperature, the development method (for example, immersion method, shaking method, showering method, spraying method, and paddling method), the development apparatus and the like are selected appropriately depending on characteristics of the composite film-forming material.

It is preferred that the aspect ratio of the patterned composite film obtained as described above be no less than 0.1. When the aspect ratio of the patterned film is no less than 0.1, the surface area of the negative electrode base member 30 increases, whereby the amount of the metal film formed by a plating process described later increases. Consequently, an additionally higher output voltage and higher energy density can be achieved.

The plating process of the negative electrode base member, and the lithium ion secondary cell according to this embodiment are similar to the plating process, and the lithium ion secondary cell of the first embodiment.

Fourth Embodiment

Negative Electrode Base Member

Figure 4:
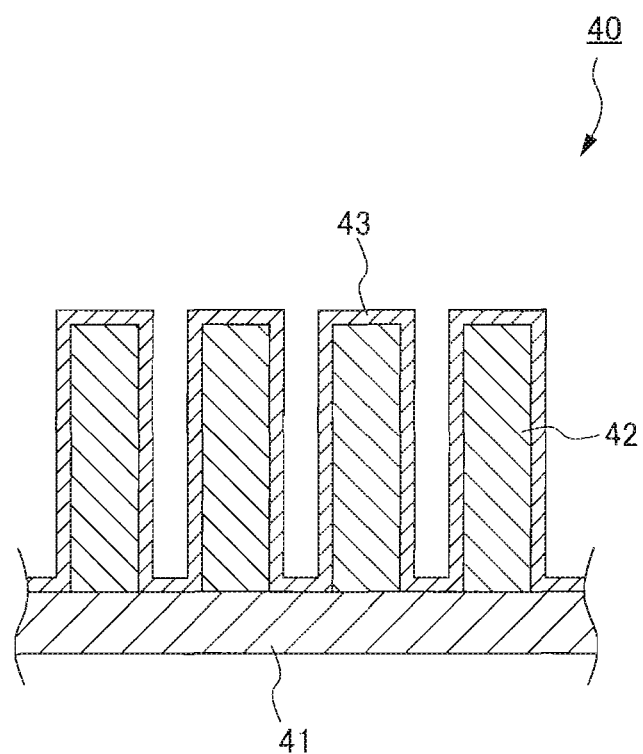
FIG. 4 shows a schematic view illustrating a negative electrode base member of Example 4 according to the present invention.

A schematic drawing of negative electrode base member 40 according to this embodiment is shown in FIG. 4. As shown in FIG. 4, the negative electrode base member 40 according to this embodiment is composed of support 41, silica coating 42, and metal film 43. More specifically, the negative electrode base member 40 according to this embodiment is composed of the support 41 having the silica coating 42 provided by pattern formation, and further the metal film 43 on the surface thereof.

The negative electrode base member 40 according to this embodiment is obtained as follows. First, a photoresist pattern is produced on the support 41. A silica coating is formed by coating a silica film-forming coating liquid on the produced photoresist pattern. Next, patterned silica coating 42 is obtained on the support 41 by removing an unnecessary photoresist pattern. Finally, the metal film 43 is formed on the support 41 having the patterned silica coating 42.

Support

The support 41 used in the negative electrode base member 40 according to this embodiment is not particularly limited as long as the photoresist pattern and the silica coating 42 can be formed on the surface thereof. For example, conventionally well-known substrates such as boards for electronic parts may be used. Specific examples include silicon wafers, silicon wafers having an organic or inorganic antireflection film, silicon wafers on which a magnetic film is formed, boards made of metal such as copper, chromium, iron, or aluminum, glass boards, and the like. These supports may serve also as a collector such as a material including at least one element selected from copper, nickel, stainless steel, molybdenum, tungsten, titanium and tantalum, a metal film, a nonwoven fabric, or a metal collector having a three-dimensional structure, or alternatively may be formed on such a collector.

Photoresist Composition, Photoresist Pattern

The photoresist composition and the photoresist pattern used in forming the negative electrode base member 40 according to this embodiment may be similar to that of the first embodiment.

Silica Coating

The silica coating 42 in the negative electrode base member 40 according to this embodiment is formed from a silica film-forming coating liquid. Specifically, the silica coating 42 may be formed by coating a silica film-forming coating liquid on a photoresist pattern formed on the negative electrode base member 40, and thereafter removing the photoresist pattern to give remaining silica coating 42 on the support 41. The silica film-forming coating liquid is constituted with a silica film-forming composition containing a siloxane polymer and a solvent.

Siloxane Polymer

The siloxane polymer which may be preferably used is exemplified by a reaction product obtained by subjecting at least one selected from silane compounds represented by the following general formula (I) to a hydrolysis reaction.

$$R_{4-n}Si(OR')_n \quad (I)$$

In the above general formula (I), R represents a hydrogen atom, an alkyl group, or a phenyl group; R' represents an alkyl group, or a phenyl group; and n represents an integer of 2 to 4. When a plurality of R bond to Si, the plurality of R may be the same or different from each other. A plurality of (OR') groups bonding to Si may be the same or different from each other. The alkyl group for R is preferably a linear or branched alkyl group having 1 to 20 carbon atoms, and more preferably a linear or branched alkyl group having 1 to 4 carbon atoms. The alkyl group for R' is preferably a linear or branched alkyl group having 1 to 5 carbon atoms. The alkyl group for R' is more preferably a linear or branched alkyl group having 1 or 2 carbon atoms particularly in light of the hydrolysis rate.

When "n" in the above general formula (I) is 4, the silane compound (I) is represented by the following general formula (II).

$$Si(OR')_a(OR^2)_b(OR^3)_c(OR^4)_d \quad (II)$$

In the above general formula (II), $R^1$, $R^2$, $R^3$, and $R^4$ each independently represent an alkyl group similar to one for R' described above, or a phenyl group. a, b, c, and d are integers that satisfy the relationship of: $0 \le a \le 4$, $0 \le b \le 4$, $0 \le c \le 4$, $0 \le d \le 4$; and $a+b+c+d=4$.

When "n" in the above general formula (I) is 3, the silane compound (ii) is represented by the following general formula (III).

$$R^5Si(OR^6)_e(OR^7)_f(OR^8)_g \quad (III)$$

In the above general formula (III), $R^5$ represents a hydrogen atom, an alkyl group similar to one for R described above, or a phenyl group. $R^6$, $R^7$, and $R^8$ each independently represent an alkyl group similar to one for R' described above, or a phenyl group. e, f, and g are integers that satisfy the relationship of: $0 \le e \le 3$, $0 \le f \le 3$, $0 \le g \le 3$; and $e+f+g=3$.

When "n" in the above general formula (I) is 2, the silane compound (iii) is represented by the following general formula (IV).

$$R^9R^{10}Si(OR^{11})_h(OR^{12})_i \quad (IV)$$

In the above general formula (IV), $R^9$ and $R^{10}$ represent a hydrogen atom, an alkyl group similar to one for R described above, or a phenyl group. $R^{11}$, and $R^{12}$ each independently represent an alkyl group similar to one for R' described above, or a phenyl group. "h" and "i" are integers that satisfy the relationship of: $0 \le h \le 2$, $0 \le i \le 2$; and $h+i=2$.

Specific examples of the silane compound (i) include tetraalkoxysilane such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane. Of these, tetramethoxysilane, and tetraethoxysilane are preferred.

Specific examples of the silane compound (ii) include trimethoxysilane, triethoxysilane, tripropoxysilane, tripentyloxysilane, triphenyloxysilane, dimethoxymonoethoxysilane, diethoxymonomethoxysilane, dipropoxymonomethoxysilane, dipropoxymonoethoxysilane, dipentyloxylmonomethoxysilane, dipentyloxymonoethoxysilane, dipentyloxymonopropoxysilane, diphenyloxylmonomethoxysilane, diphenyloxymonoethoxysilane, diphenyloxymonopropoxysilane, methoxyethoxypropoxysilane, monopropoxydimethoxysilane, monopropoxydiethoxysilane, monobutoxydimethoxysilane, monopentyloxydiethoxysilane, monophenyloxydiethoxysilane, methyltrimethoxysilane, methyltriethoxysilane, methyltripropoxysilane, methyltripentyloxysilane, ethyltrimethoxysilane, ethyltripropoxysilane, ethyltripentyloxysilane, ethyltriphenyloxysilane, propyltrimethoxysilane, propyltriethoxysilane, propyltripentyloxysilane, propyltriphenyloxysilane, butyltrimethoxysilane, butyltriethoxysilane, butyltripropoxysilane, butyltripentyloxysilane, butyltriphenyloxysilane, methylmonomethoxydiethoxysilane, ethylmonomethoxydiethoxysilane, propylmonomethoxydiethoxysilane, butylmonomethoxydiethoxysilane, methylmonomethoxydipropoxysilane, methylmonomethoxydipentyloxysilane, methylmonomethoxydiphenyloxysilane, ethylmonomethoxydipropoxysilane, ethylmonomethoxydipentyloxysilane, ethylmonomethoxydiphenyloxysilane, propylmonomethoxydipropoxysilane, propylmonomethoxydipentyloxysilane, propylmonomethoxydiphenyloxysilane, butylmonomethoxydipropoxysilane, butylmonomethoxydipentyloxysilane, butylmonomethoxydiphenyloxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane, butylmonomethoxymonoethoxymonobutoxysilane, and the like. Of these, trimethoxysilane, triethoxysilane, and methyltrimethoxysilane are preferred.

Specific examples of the silane compound (iii) include dimethoxysilane, diethoxysilane, dipropoxysilane, dipentyloxysilane, diphenyloxysilane, methoxyethoxysilane, methoxypropoxysilane, methoxypentyloxysilane, methoxyphenyloxysilane, ethoxypropoxysilane, ethoxypentyloxysilane, ethoxyphenyloxysilane, methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane, and the like. Of these, dimethoxysilane, diethoxysilane, methyldimethoxysilane, and methyldiethoxysilane are preferred.

Among these silane compounds, combinations of methyltrialkoxysilane and tetraalkoxysilane are preferred. The molar ratio of blended methyltrialkoxysilane and tetraalkoxysilane is preferably 30:70 to 90:10.

In addition, the mass average molecular weight of the siloxane polymer preferably falls within the range of 1,000 to 10,000. This is mainly because the film forming properties and flatness of the film can be easily secured, and excellent etching resistance is achieved. Specifically, the siloxane polymer volatilizes when the molecular weight is too low, and thus the film formation may fail.

Solvent

Examples of the solvent include: monovalent alcohols such as methyl alcohol, ethyl alcohol, propyl alcohol, and butyl alcohol; polyhydric alcohols such as ethylene glycol, diethylene glycol, propylene glycol, glycerin, trimethylolpropane, and hexanetriol; monoethers of a polyhydric alcohol such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, and propylene glycol monobutyl ether; esters such as methyl acetate, ethyl acetate, and butyl acetate; ketones such as acetone, methylethylketone, cycloalkyl ketone, and methylisoamyl ketone; polyhydric alcohol ethers obtained by alkyl etherification of all hydroxyl groups of a polyhydric alcohol such as ethylene glycol dimethyl ether, ethylene glycol diethyl ether, ethylene glycol dipropyl ether, ethylene glycol dibutyl ether, propylene glycol dimethyl ether (PGDM), propylene glycol diethyl ether, propylene glycol dibutyl ether, diethylene glycol dimethyl ether, diethylene glycol methylethyl ether, and diethylene glycol diethyl ether; and the like. Among these, cycloalkyl ketone or alkylene glycol dialkyl ether is more preferred. Moreover, PGDM (propylene glycol dimethyl ether) is more preferred as the alkylene glycol dimethyl ether. These organic solvents may be used alone, or in combination of two or more thereof. The solvent may be preferably blended in the range of 70 to 99% by mass in the silica film-forming composition.

Others

The silica film-forming composition may also contain other component in addition to the siloxane polymer and the solvent described above. For example, a cyclic basic compound may be also included. Cyclic amines are preferred for the cyclic basic compound, and more specifically, DBU (1,8-diazabicyclo(5,4,0)undec-7-ene) is preferably used.

The amount of the cyclic basic compound added is preferably 10 ppm to 1% based on the solid content of the siloxane polymer. When the amount falls within this range, polymerization of the siloxane polymer is accelerated, whereby the moisture content in the coating may be reduced. Moreover, liquid stability of the silica film-forming composition increases, and favorable coating properties are achieved.

Additionally, the silica film-forming composition may also include porogen. Porogen means a material which is decomposed during baking of the coating film constituted with the silica film-forming composition, and forms pores on the silica coating 12 finally formed. Such porogen is exemplified by polyalkylene glycol and end-alkylated products thereof.

The alkylene group of the polyalkylene glycol has carbon atoms of preferably 1 to 5, and more preferably 1 to 3. Specific examples of the polyalkylene glycol include lower alkylene glycols such as polyethylene glycol, and polypropylene glycol.

The end-alkylated products of polyalkylene glycols are those where the hydroxy group at either one or both ends of the polyalkylene glycols are alkoxylated by an alkyl group. The alkyl group used in the end-alkoxylation may be a linear or branched alkyl group, and the carbon number thereof is preferably 1 to 5, and more preferably 1 to 3. The alkyl group is particularly preferably a linear alkyl group such as a methyl group, ethyl group and propyl group.

The mass average molecular weight (Mw) of the polyalkylene glycol is preferably 100 to 10,000, more preferably 200 to 5,000, and still more preferably 400 to 4,000. The upper limit of the mass average molecular weight not exceeding the above range may lead to proper coating properties without impairing compatibility of the coating liquids, and appropriate film-thickness uniformity of the silica coating 42 can be attained. The lower limit not below the above range is preferred since porous silica coating 42 can be formed, thus allowing a grater buffering action to be achieved.

The amount of the porogen used is preferably 25 to 100% by mass, and more preferably 30 to 70% by mass based on the solid content of the silica film-forming composition (converted mass of $SiO_2$). By thus including the solvent component in an amount not below the lower limit of the above range, porosity can be attained. Whereas, by including the solvent component in an amount not exceeding the upper limit of the above range, the silica coating 42 having sufficient strength can be obtained.

The silica coating 42 is formed by coating the silica film-forming coating liquid on the support 41 having the photoresist pattern produced thereon, followed by heat drying and baking, and then removing the photoresist pattern. The coating method of the silica film-forming coating liquid is not particularly limited, and any coating method such as, for example, a spraying method, a spin coating method, a dip coating method, or a roll coating method may be employed.

The heat drying is preferably carried out at 80 to 300° C. over 1 to 6 min, and stepwise-warming with three or more steps is more preferred. For example, after subjecting to the first drying process in the ambient air or in an atmosphere of inert gas such as nitrogen for 30 sec to 2 min at 70 to 120° C., the second drying process is carried out for 30 sec to 2 min at 130 to 220° C., and then the third drying process is further carried out for 30 sec to 2 min at 150 to 300° C. In this way, a coating film with a uniform surface can be obtained by carrying out a stepwise drying process including three or more steps, and preferably about three to six steps.

The baking may be carried out at a temperature of about 300 to 400° C. in a nitrogen atmosphere.

The silica coating formed on the upper part of the resist pattern can be removed appropriately by subjecting the entire face of the support to an etching process (etching back), or the like. In this procedure, the etching process may be carried out by using a known etching method.

The cleaning liquid for use in removing the photoresist pattern is not particularly limited, and a conventionally well-known cleaning liquid for photoresists may be used. For example, any one of an organic-based cleaning liquid, a water-based cleaning liquid, and an $O_2$ ashing process may be employed.

The plating process of the negative electrode base member, and the lithium ion secondary cell according to this embodiment are similar to the plating process, and the lithium ion secondary cell of the first embodiment.

EXAMPLES

The present invention will be explained in more detail by way of Examples. It should be noted that the present invention is not limited to the following Examples.

Pattern Formation

Example 1

A negative-type photoresist composition 1 was prepared by mixing 100 parts by mass of "Epicoat 157S70 (trade name, manufactured by Japan Epoxy Resins Co., Ltd.)" that is a polyfunctional bisphenol A novolak epoxy resin, 5 parts by mass of "UVI-6992 (trade name, manufactured by The Dow Chemical Corporation)" that is a mixture of diphenyl[4-(phenylthio)phenyl]sulfonium hexafluorophosphate and thiodi-p-phenylene bis(diphenylsulfonium)bis(hexafluorophosphate), 5 parts by mass of 1,5-dihydroxynaphthalene, and 43 parts by mass of γ-butyrolactone.

Example 1a

The negative-type resist composition 1 was coated on a silicon wafer by way of a spin coater, and then dried, thereby obtaining a photosensitive resin composition layer having a film thickness of 20 μm. The negative-type resist composition layer 1 was prebaked at 60° C. for 5 min and at 90° C. for 5 min using a hot plate. Thereafter, pattern exposure (soft contact, ghi ray) was carried out using PLA-501F (Contact aligner: manufactured by Canon Inc.), followed by post-exposure baking (PEB) carried out at 90° C. for 5 minutes using a hot plate, and PGMEA was employed to carry out a development process by an immersion process for 4 min. Next, the developed resin pattern was post-baked together with the substrate at 200° C. for 1 hour using an oven to obtain a photoresist pattern 1a with a pillar shape having a width of 10 μm (pitch: 20 μm) on a silicon wafer.

Example 1b

Furthermore, a positive-type photoresist composition having a solid content of 40% by mass was prepared by: uniformly dissolving in propylene glycol monomethyl ether acetate, 1 part by mass of a compound represented by the following formula (z1) (K-1S (trade name): manufactured by San-Apro Ltd.), 40 parts by mass of a resin whose alkali solubility can be increased by the action of an acid represented by the following formula (z2), 60 parts by mass of a novolac resin obtained by addition condensation of m-cresol and p-cresol in the presence of formaldehyde and an acid catalyst, and 1 part by mass of 1,5-dihydroxynaphthalene; and filtrating the solution through a membrane filter having a pore size of 1 μm. In a similar manner to the pattern formation of the aforementioned negative-type photoresist composition, a photoresist pattern 1b with a pillar shape having a width of 10 μm (pitch: 20 μm) was obtained on a silicon wafer.

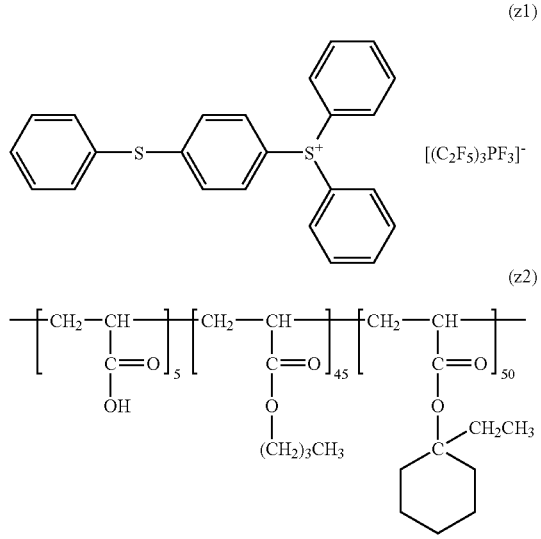

Example 1c

A positive-type photoresist composition was prepared by mixing: as the component (A), 13 g of a novolac resin having a Mw of 5,200, which was synthesized by a common procedure using mixed phenols of m-cresol/p-cresol/2,3,5-trimethyl phenol=40/35/25 (molar ratio), and mixed aldehydes of salicyl aldehyde/formaldehyde=1/5 (molar ratio); as the component (B), 7.5 g of a mixture which contains an esterification reaction product of 1 mol of bis(5-cyclohexyl-4-hydroxy-2-methylphenyl)-3,4-dihydroxyphenylmethane (B1) with 2 mol of 1,2-naphthoquinone diazide-5-sulfonylchloride [hereinafter, abbreviated as (5-NQD)], an esterification reaction product of 1 mol of bis(2,4-dihydroxyphenyl)methane (B2) with 2 mol of 5-NQD, and an esterification reaction product of 1 mol of bis(4-hydroxy-2,3,5-trimethylphenyl)-2-hydroxyphenylmethane (B3) with 2 mol of 5-NQD (mixing ratio by mass=B1:B2:B3=4:1:1); and as the component (C), 5.5 g of bis(2-methyl-4-hydroxyphenyl)-phenylmethane, and 74 g of propylene glycol monomethyl ether acetate solvent.

Thus resulting positive-type photoresist composition was coated on a silicon wafer, and subjected to a prebaking treatment, whereby an organic film having a film thickness of 1.48 μm was formed. Selective exposure of the organic film was carried out with an i-ray exposure equipment (trade name "NSR-2005i10D"; manufactured by Tokyo Ohka Kogyo Co., Ltd.), followed by a development process with 2.38% by mass of tetramethylammonium hydroxide in an aqueous solution (trade name "NMD-3"; manufactured by Tokyo Ohka Kogyo Co., Ltd.) for 60 sec. Thereafter, the film was rinsed with pure water for 30 sec, and then dried to form a patterned organic film 1c with a pillar shape having a width of 5 μm (pitch: 20 μm).

Example 2a

A photoresist pattern was formed in a similar manner to Example 1a except that the metal oxide film was not formed. On the other hand, a metal oxide film-forming material was prepared by dissolving silane tetraisocyanate ($Si(NCO)_4$) in p-menthane to give a 100 mM solution. After this metal oxide film-forming material was coated uniformly on a photoresist pattern by spin coating (at 100 rpm for 10 sec), the film was washed with p-menthane (at 500 rpm for 10 sec), and then dried by swinging off at 2,000 rpm for 10 sec and at 3,000 rpm for 10 sec. As a result, photoresist pattern 2a having a uniform coating layer (silicon oxide film ($SiO_2$)) formed on the surface thereof was obtained. This coating layer was an ultrathin film having a film thickness of about 1 nm.

Example 2b

A photoresist pattern 2b was formed in a similar manner to Example 2a except that photoresist pattern 1b was used.

Example 3

An organic component liquid was prepared by mixing 5 parts by mass of hydroxypropylcellulose as a water soluble cellulose derivative, 5 parts by mass of a styrene/hydroxyethyl methacrylate=60/40 (% by mass) copolymer (Mw=30,000) as an acrylic resin having a hydroxy group, 15 parts by mass of 2-hydroxy-3-phenoxypropyl acrylate (trade name M-600A, manufactured by Kyoeisha Chemical Co., Ltd.) as a photopolymerizable monomer, 1.0 part by mass of 2,2-dimethoxy-2-phenylacetophenone (trade name IR-651, manufactured by Ciba-Geigy Co.) as a photopolymerization initiator, 12 parts by mass of dicyclohexyl phthalate as a plasticizer, and 100 parts by mass ethyl acetate as a solvent, with a stirrer for 3 hours. Subsequently, 35 parts by mass of this organic component liquid (solid content: 50% by mass) was kneaded with 82.5 parts by mass of glass frit as an inorganic component to prepare a composite film-forming material.

Next, thus prepared composite film-forming material was coated on polyethylene terephthalate, and the coating was dried at 100° C. for 6 min to remove the solvent completely, whereby a composite film having a thickness of 27 μm was formed.

Thereafter, thus produced composite film was laminated on a silicon wafer heated to 80° C. beforehand with a hot roll laminator at 105° C. The air pressure was adjusted to 3 kg/cm², and the lamination rate was adjusted to 1.0 m/min. Subsequently, polyethylene terephthalate as a support film was peeled, and ultraviolet ray exposure was carried out through a pattern mask at exposure dose of 500 mJ/cm² using an ultra high-pressure mercury lamp. Using water having a liquid temperature of 30° C., spray development of 5 times breakpoint was carried out with an injection pressure of 3 kg/cm² to form a patterned composite film 3 with a pillar shape having a width of 10 μm (pitch: 20 μm). The breakpoint herein refers to a time in the exposure process taken until the unexposed region completely disappears.

Example 4

A positive-type resist composition was obtained in a similar manner to Example 2b except that the solid content by mass was 20% by mass.

The positive-type resist composition was coated on a silicon wafer by way of a spin coater, and then dried, thereby obtaining a photosensitive resin composition layer having a film thickness of 2 μm. The positive-type resist composition layer was prebaked at 130° C. for 1 min using a hot plate. Thereafter, pattern exposure (soft contact, ghi ray) was carried out using PLA-501F (Contact aligner: manufactured by Canon Inc.), followed by post-exposure baking (PEB) carried out at 75° C. for 5 minutes, and 3% by mass tetramethylammonium hydroxide was employed to carry out a development process by an immersion process for 2 min. A photoresist pattern with a hole shape having a diameter of 1 μm (pitch: 2 μm) was produced on a silicon wafer.

On the other hand, 220.0 g of methyltrimethoxysilane, 246.0 g of tetramethoxysilane, and 301.0 g of propylene glycol monopropyl ether were mixed, and stirred. To the mixture were added 204.0 g of water and 52 μL of 60% nitric acid, and additionally, stirred for 3 hours. Thereafter, the reaction proceeded at 26° C. for 2 days. The reaction product in an amount of 8.0 g, 11.8 g of propylene glycol monopropyl ether, and 0.2 g of a 0.1% DBU solution in propylene glycol monopropyl ether were mixed, whereby a silica film-forming composition was obtained.

The resulting silica film-forming composition was coated on the silicon wafer having the photoresist pattern formed thereon by spin coating on each hot plate at 80° C., 150° C., and 200° C. for 1 min each. Furthermore, an immersion process was carried out using Strip 104 (manufactured by Tokyo Ohka Kogyo Co., Ltd.) at 70° C. for 20 min, and then baking was carried out in a nitrogen atmosphere at 400° C. for 30 min to form a silica coating 4 having a film thickness of about 2 μm.

Production of Negative Electrode Base Member

The silicon wafer having the silicon oxide film thus formed on the photoresist pattern 1a or 1b, the silicon wafer having the photoresist pattern 2a or 2b, the patterned composite film 3, the silica coating 4 on the pattern, or the patterned organic film 5 formed thereon was subjected to a washing treatment by immersing in a sodium phosphate solution for 60 sec. Subsequently, following the washing step, the silicon wafer was subjected to a catalyzing step by immersing in a 0.05 g/dm$^3$ aqueous tin chloride (SnCl$_2$) solution for 60 sec, and further immersing in a 0.05 g/dm$^3$ aqueous palladium chloride (PdCl$_2$) solution for 60 sec.

Next, the silicon wafer following the catalyzing step was subjected to a nickel plating process by immersing in a nickel plating bath including 0.20 M nickel sulfate, 0.30 M sodium hypophosphite, a 0.30 ppm lead ion, and a 0.30 M complexing agent of carboxylic acids. In this step, the temperature of the nickel plating bath was regulated to be 70° C., and the pH was adjusted to 5.5.

Additionally, the silicon wafer following the electroless nickel plating step was subjected to a tin plating process by immersing in a tin plating bath including 0.20 M tin chloride, a 0.08 M reducing agent such as titanium trichloride, and 0.50 M trisodium citrate. In this step, the temperature of the tin plating bath was regulated to be 70° C., and the pH was adjusted to 8.5.

The nonaqueous electrolyte secondary cell in which the negative electrode base member having the photoresist pattern 1a obtained in Example 1 above was used (hereinafter, referred to as battery Example 1a), the nonaqueous electrolyte secondary cell in which the negative electrode base member having the photoresist pattern 1b obtained in Example 1 above was used (hereinafter, referred to as battery Example 1b), the nonaqueous electrolyte secondary cell in which the negative electrode base member having the photoresist pattern 2a was used (hereinafter, referred to as battery Example 2a), the nonaqueous electrolyte secondary cell in which the negative electrode base member having the photoresist pattern 2b was used (hereinafter, referred to as battery Example 2b), the nonaqueous electrolyte secondary cell in which the negative electrode base member having the photoresist pattern 3 was used (hereinafter, referred to as battery Example 3), the nonaqueous electrolyte secondary cell in which the negative electrode base member having the silica coating 4 on the pattern was used (hereinafter, referred to as battery Example 4), the nonaqueous electrolyte secondary cell in which the negative electrode base member having the patterned organic film 5 was used (hereinafter, referred to as battery Example 5) were produced. The electric discharge capacity following one to three cycles of these cells was measured by the following method. The results are shown in Table 1 below.

The nonaqueous electrolyte secondary cells were produced as follows. The negative electrode base member obtained in Example as a working electrode, and LiCoO$_2$ as a counter electrode (positive electrode) were used to allow both electrodes to be opposed via a separator. A mixture of LiPF$_6$/ethylene carbonate and dimethyl carbonate (1:1 by capacity ratio) was used as a nonaqueous electrolyte, and a nonaqueous electrolyte secondary cell was produced according to an ordinary process. In this nonaqueous electrolyte secondary cell, the capacity ratio of the positive electrode to the negative electrode was 1:1.

For each electric discharge capacity following one to three cycles, the electric discharge capacity per unit volume (mAh/cm$^2$) was measured. The electric discharge capacity per unit volume was determined on the basis of the volume of the negative electrode as a standard. However, the expansion of the negative electrode while charging was not considered.

TABLE 1

|  | Discharge capacity | | |
|---|---|---|---|
|  | After 1st cycle | After 2nd cycle | After 3rd cycle |
| Battery Example 1a | 2944 | 2236 | 2482 |
| Battery Example 1b | 2645 | 2473 | 2399 |
| Battery Example 1c | 1650 | 1521 | 1674 |
| Battery Example 2a | 2802 | 2650 | 2532 |
| Battery Example 2b | 2777 | 2712 | 2687 |
| Battery Example 3 | 2544 | 2432 | 2454 |
| Battery Example 4 | 2748 | 2591 | 2465 |

With respect to the negative electrode base member described above, the surface area of the negative electrode base member subjected to the tin plating process of Example accounted for about 190% of the surface area yielded by subjecting to the same plating process on a plane. Only the negative electrode base member having the patterned organic film 5 exhibited such a surface area of about 115%.

INDUSTRIAL APPLICABILITY

According to the negative electrode base member of the present invention, achieving a battery which has a high output voltage and a high energy density, and is superior in charge and discharge cycle characteristics is enabled. The battery can be used in a variety of applications regardless of the capacity, such as e.g., batteries including from minute batteries used in portable devices and the like to large-sized batteries used in hybrid cars and the like.

What is claimed is:

1. A secondary cell comprising:
   a negative electrode base member, comprising a support, an organic film formed on a portion of the support and a metal film formed on the organic film and on another portion of the support, wherein the organic film is a photoresist film;
   an electrolyte solution; and
   a positive electrode base member which can store and release the electrolyte solution.

2. The secondary cell according to claim 1 wherein the photoresist film is a photoresist pattern having a predetermined shape formed by pattern exposure.

3. The secondary cell according to claim 2 wherein the photoresist pattern has an aspect ratio of no less than 0.1.

4. The secondary cell according to claim 1 wherein the photoresist film is formed from a positive-type photoresist composition comprising an acid generator component capable of producing an acid upon irradiation with an actinic ray or radiation, and a resin component whose alkali solubility increases by the action of an acid.

5. The secondary cell according to claim 1 wherein the photoresist film is formed from a negative-type photoresist composition comprising a radical polymerization initiator and a polyfunctional epoxy resin.

6. The secondary cell according to claim 1 wherein the photoresist film is formed from a positive-type photoresist composition comprising an alkali-soluble resin as component (A2) and a quinone diazide group-containing compound as component (B2).

7. The secondary cell according to claim 6 wherein the component (A2) is at least one selected from a novolac resin, a hydroxystyrene based resin, and an acrylic resin.

8. The secondary cell according to claim 6 wherein the component (B2) is an esterification reaction product of 1,2-naphthoquinone diazidesulfonyl compound with a compound represented by the following general formula (b2a):

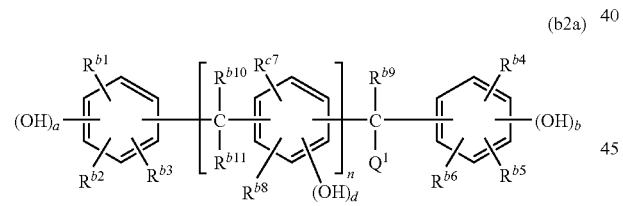

(b2a)

wherein, $R^{b1}$ to $R^{b8}$ each independently represent a hydrogen atom, a halogen atom, an alkyl group having 1 to 6 carbon atoms, an alkoxy group having 1 to 6 carbon atoms, or a cycloalkyl group having 3 to 6 carbon atoms; $R^{b10}$ and $R^{b11}$ each independently represent a hydrogen atom, or an alkyl group having 1 to 6 carbon atoms; when $R^{b9}$ represents a hydrogen atom, or an alkyl group having 1 to 6 carbon atoms, $Q^1$ represents a hydrogen atom, an alkyl group having 1 to 6 carbon atoms, or a residue represented by the following chemical formula (b2b):

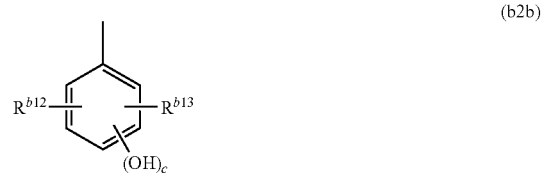

(b2b)

wherein, $R^{b12}$ and $R^{b13}$ each independently represent a hydrogen atom, a halogen atom, an alkyl group having 1 to 6 carbon atoms, an alkoxy group having 1 to 6 carbon atoms, or a cycloalkyl group having 3 to 6 carbon atoms, and c represents an integer of 1 to 3;
when $Q^1$ bonds to the terminal of $R^{b9}$, $Q^1$ forms a cycloalkylene chain having 3 to 6 carbon atoms together with $R^{b9}$, and a carbon atom between $Q^1$ and $R^{b9}$; a and b represent an integer of 1 to 3; d represents an integer of 0 to 3; and n represents an integer of 0 to 3.

9. The secondary cell according to claim 1 wherein the metal film is formed by a plating process.

10. The secondary cell according to claim 9 wherein the plating process is at least one selected from the group consisting of an electroless copper plating process, an electroless nickel plating process, an electroless tin plating process, and an electrolytic tin plating process.

11. The secondary cell according to claim 9 wherein the plating process is a multi-step plating process including: at least one of an electroless copper plating process and an electroless nickel plating process; and at least one of an electroless tin plating process and an electrolytic tin plating process.

12. The secondary cell according to claim 1 wherein the negative electrode base member is a negative electrode base member for secondary cells.

13. A secondary cell comprising:
    a negative electrode base member, comprising a support, an organic film formed on the support, a metal oxide film formed on the organic film and a metal film formed on the metal oxide film, wherein the organic film is a photoresist film;
    an electrolyte solution; and
    a positive electrode base member which can store and release the electrolyte solution.

14. The secondary cell according to claim 13 wherein the metal oxide film is a silica coating.

15. The secondary cell according to claim 13 wherein the metal oxide film is formed from a silica film-forming material comprising a metal compound which can yield a hydroxy group by hydrolysis, and a solvent that dissolves the metal compound and does not have a functional group that is reactive with the metal compound.

* * * * *